(12) United States Patent
Miyajima et al.

(10) Patent No.: US 11,910,696 B2
(45) Date of Patent: Feb. 20, 2024

(54) SELF-LUMINOUS DISPLAY PANEL AND SELF-LUMINOUS DISPLAY PANEL MANUFACTURING METHOD

(71) Applicant: JDI Design and Development G.K., Tokyo (JP)

(72) Inventors: Akio Miyajima, Tokyo (JP); Michitoshi Tsuchiya, Tokyo (JP); Hiroki Kato, Tokyo (JP); Makoto Noda, Tokyo (JP); Masaichi Okubo, Tokyo (JP); Mario Amatsuchi, Tokyo (JP)

(73) Assignee: JDI DESIGN AND DEVELOPMENT G.K., Tokyo (JP)

( * ) Notice: Subject to any disclaimer, the term of this patent is extended or adjusted under 35 U.S.C. 154(b) by 205 days.

(21) Appl. No.: 17/521,896

(22) Filed: Nov. 9, 2021

(65) Prior Publication Data
US 2022/0149314 A1 May 12, 2022

(30) Foreign Application Priority Data
Nov. 9, 2020 (JP) ................ 2020-186616

(51) Int. Cl.
*H01L 51/52* (2006.01)
*H01L 51/56* (2006.01)
(Continued)

(52) U.S. Cl.
CPC ......... *H10K 71/861* (2023.02); *H10K 50/822* (2023.02); *H10K 50/826* (2023.02);
(Continued)

(58) Field of Classification Search
CPC ....... H10K 71/861; H10K 50/805–828; H10K 59/805–80524
See application file for complete search history.

(56) References Cited

U.S. PATENT DOCUMENTS

| 6,605,372 B1 * | 8/2003 | Kubota ................. H10K 59/17 |
| | | 313/506 |
| 2004/0096993 A1 * | 5/2004 | Kuo ....................... H10K 71/70 |
| | | 438/10 |

(Continued)

FOREIGN PATENT DOCUMENTS

| JP | S62-287596 A | * 12/1987 | ............. H05B 33/10 |
| JP | S62-287596 A | 12/1987 | |

(Continued)

OTHER PUBLICATIONS

Machine translation, Oyamada, WIPO Pat. Pub. No. WO-2012140924-A1, translation date: Jul. 27, 2023, Clarivate Analytics, all pages. (Year: 2023).*

(Continued)

*Primary Examiner* — Victoria K. Hall
(74) *Attorney, Agent, or Firm* — XSENSUS LLP

(57) ABSTRACT

A self-luminous display panel 10 in which self-luminous elements 2 are arranged on a plane, wherein each of the self-luminous elements includes: a pair of electrodes 13, 20 disposed facing each other, an electrode of the pair of electrodes including a metal layer 20A; functional layers 15, 16, 17, 18, 19 including a light emitting layer 17, disposed between the pair of electrodes; and a sealing layer 21 that covers the pair of electrodes and the functional layers from a direction. The self-luminous elements include a repaired self-luminous element 2'. The repaired self-luminous element includes a foreign object FO among the functional layers. The electrode including the metal layer has a high resistance portion 201 surrounding, in plan view, an area containing the foreign object, and has a thickened portion 202 of the metal layer at an outer edge, in plan view, of the high resistance portion.

16 Claims, 17 Drawing Sheets

(51) Int. Cl.
   *H01L 27/32* (2006.01)
   *H10K 71/00* (2023.01)
   *H10K 59/12* (2023.01)
   *H10K 50/822* (2023.01)
   *H10K 50/826* (2023.01)
   *H10K 50/84* (2023.01)
   *H10K 59/35* (2023.01)
   *H10K 102/00* (2023.01)
   *H10K 50/828* (2023.01)

(52) U.S. Cl.
   CPC ......... *H10K 59/1201* (2023.02); *H10K 71/00* (2023.02); *H10K 50/828* (2023.02); *H10K 50/841* (2023.02); *H10K 59/353* (2023.02); *H10K 2102/351* (2023.02)

(56) References Cited

U.S. PATENT DOCUMENTS

| | | | | |
|---|---|---|---|---|
| 2004/0097160 | A1* | 5/2004 | Kaltenbach | H10K 71/00 382/141 |
| 2005/0215163 | A1* | 9/2005 | Tamura | H10K 71/70 445/24 |
| 2006/0178072 | A1* | 8/2006 | Konda | H10K 71/00 445/6 |
| 2006/0214575 | A1* | 9/2006 | Kajiyama | H10K 50/00 313/506 |
| 2008/0233826 | A1* | 9/2008 | Matsuda | H10K 50/844 445/2 |
| 2010/0018956 | A1* | 1/2010 | Watts | H10K 71/162 219/121.72 |
| 2010/0140644 | A1* | 6/2010 | Kai | H10K 71/00 257/E33.059 |
| 2010/0213438 | A1 | 8/2010 | Cho et al. | |
| 2011/0018434 | A1* | 1/2011 | Miyaguchi | H10K 50/826 313/512 |
| 2011/0104842 | A1* | 5/2011 | Miyazawa | H10K 50/11 438/34 |
| 2012/0264235 | A1* | 10/2012 | Hiraoka | H10K 71/00 438/4 |
| 2012/0270460 | A1* | 10/2012 | Miyazawa | H10K 71/00 445/2 |
| 2012/0274202 | A1* | 11/2012 | Komatsu | H10K 71/60 313/506 |
| 2013/0102094 | A1* | 4/2013 | Hiraoka | H10K 71/00 438/16 |
| 2013/0248844 | A1* | 9/2013 | Hiraoka | H05B 33/10 438/4 |
| 2013/0320323 | A1* | 12/2013 | Segawa | H10K 50/813 438/4 |
| 2014/0008625 | A1* | 1/2014 | Hiraoka | H05B 33/10 438/26 |
| 2014/0008627 | A1* | 1/2014 | Hiraoka | H10K 71/00 438/4 |
| 2014/0209891 | A1* | 7/2014 | Hiraoka | H10K 59/10 438/4 |
| 2015/0115251 | A1* | 4/2015 | Jinta | H10K 50/828 257/40 |
| 2015/0364726 | A1* | 12/2015 | Kim | H10K 71/00 438/4 |
| 2017/0012246 | A1* | 1/2017 | Onimaru | H10K 59/122 |
| 2017/0077460 | A1* | 3/2017 | Hayashida | H10K 59/122 |
| 2017/0117506 | A1* | 4/2017 | Hiraoka | H05B 44/00 |
| 2017/0170244 | A1* | 6/2017 | Kobayashi | H10K 59/122 |
| 2017/0222149 | A1* | 8/2017 | Nakadaira | H10K 50/844 |
| 2017/0301889 | A1* | 10/2017 | Hayashida | H10K 71/135 |
| 2017/0331041 | A1* | 11/2017 | Hiraoka | H01L 33/42 |
| 2018/0122878 | A1* | 5/2018 | Kim | H10K 59/353 |
| 2019/0067395 | A1* | 2/2019 | Kondo | H10K 71/135 |
| 2019/0305258 | A1* | 10/2019 | Lin | H10K 50/841 |
| 2020/0395571 | A1* | 12/2020 | Kwon | H10K 50/844 |
| 2021/0193952 | A1* | 6/2021 | Shim | H10K 59/126 |
| 2022/0254846 | A1* | 8/2022 | Shinokawa | G09F 9/00 |

FOREIGN PATENT DOCUMENTS

| | | | | |
|---|---|---|---|---|
| JP | 2008-235177 | A | | 10/2008 |
| JP | 2008-235178 | A | * | 10/2008 ......... H10K 71/861 |
| JP | 2008-235178 | A | | 10/2008 |
| JP | 2008235177 | A | * | 10/2008 ......... H10K 71/861 |
| JP | 2010-199067 | A | | 9/2010 |
| JP | 2013114748 | A | * | 6/2013 ............ H01L 51/50 |
| JP | 2015-088319 | A | | 5/2015 |
| JP | 5963342 | B2 | | 8/2016 |
| WO | WO-2012140924 | A1 | * | 10/2012 ......... H10K 50/844 |
| WO | WO-2012176276 | A1 | * | 12/2012 ......... H10K 71/00 |
| WO | 2015/190092 | A1 | | 12/2015 |
| WO | 2016/084408 | A1 | | 6/2016 |

OTHER PUBLICATIONS

Machine translation, Kojima, WIPO Pat. Pub. No. WO-2012176276-A1, translation date: Jul. 27, 2023, Clarivate Analytics, all pages. (Year: 2023).*

Machine translation, Hiraoka, Japanese Pat. Pub. No. JP2013114748A, translation date: Jul. 27, 2023, Espacenet, all pages. (Year : 2023).*

Machine translation, Hayashi, Japanese Pat. Pub. No. JPS62287596A, translation date: Jul. 27, 2023, Espacenet, all pages. (Year: 2023).*

Machine translation, Uchida, Japanese Pat. Pub. No. JP-2008235177-A, translation date: Jul. 27, 2023, Espacenet, all pages. (Year: 2023).*

Machine translation, Mizusaki, Japanese Pat. Pub. No. JP-2008235178-A, translation date: Jul. 27, 2023, Espacenet, all pages. (Year: 2023).*

* cited by examiner

FIG. 3
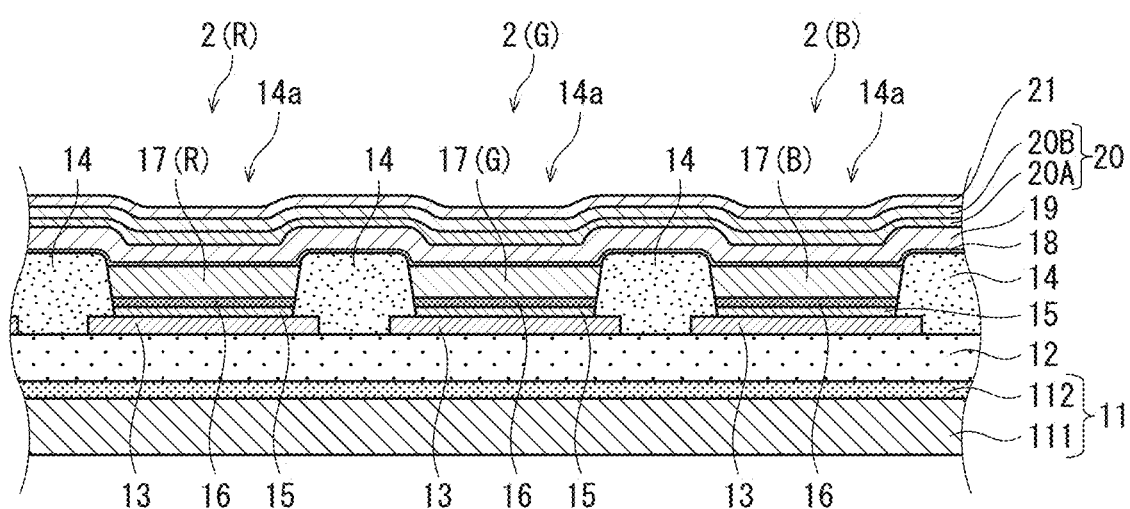
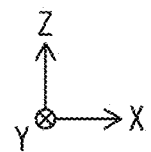

SELF-LUMINOUS DISPLAY PANEL AND SELF-LUMINOUS DISPLAY PANEL MANUFACTURING METHOD

This application claims priority to Japanese Patent Application No. 2020-186616 filed Nov. 9, 2020, the contents of which are hereby incorporated by reference in their entirety.

BACKGROUND

Technical Field

The present disclosure relates to self-luminous display panels and self-luminous display panel manufacturing methods.

Description of Related Art

In recent years, as self-luminous displays using organic electroluminescence (EL) elements that utilize electroluminescence of organic material, organic EL panels in which organic EL elements are arranged in a matrix on a substrate are being put into practical use as electronic display devices. Each organic EL element has a basic structure in which various functional layers such as an electron transport layer and an organic light emitting layer containing an organic light emitting material are laminated between an anode and a cathode electrode pair. When driven, a voltage is applied between the electrodes, and holes injected from the anode and electrons injected from the cathode recombine, such that the organic EL element is a current-driven light emitting element that generates a wavelength specific to the organic light emitting material.

In such display devices, foreign matter may be mixed between the anode and the cathode of the organic EL element during manufacture, such that a dead point due to a short circuit between the anode and the cathode may occur. To combat this, a repair technique has been proposed for recovering a light emitting element that has become a dead point by removing a short-circuited portion of the light emitting element by laser irradiation from outside, or by increasing resistance (for example, see JP S62-287596, JP 2008-235177, WO 2015/190092).

SUMMARY

A self-luminous display panel pertaining to an aspect of the present disclosure is a self-luminous display panel in which self-luminous elements are arranged on a plane, wherein each of the self-luminous elements includes a pair of electrodes, functional layers including a light emitting layer, and a sealing layer. The pair of electrodes face other, and an electrode of the pair of electrodes includes a metal layer. The functional layers are disposed between the pair of electrodes. The sealing layer covers the pair of electrodes and the functional layers from a direction. The self-luminous elements include a repaired self-luminous element that further includes a foreign object among the functional layers. The electrode including the metal layer has a high resistance portion surrounding, in plan view, an area containing the foreign object, and has a thickened portion of the metal layer at an outer edge, in plan view, of the high resistance portion.

BRIEF DESCRIPTION OF DRAWINGS

FIG. 3 is a schematic cross section diagram of organic EL display panel 10 taken along line A-A of FIG. 2.

DETAILED DESCRIPTION

Figure 1:
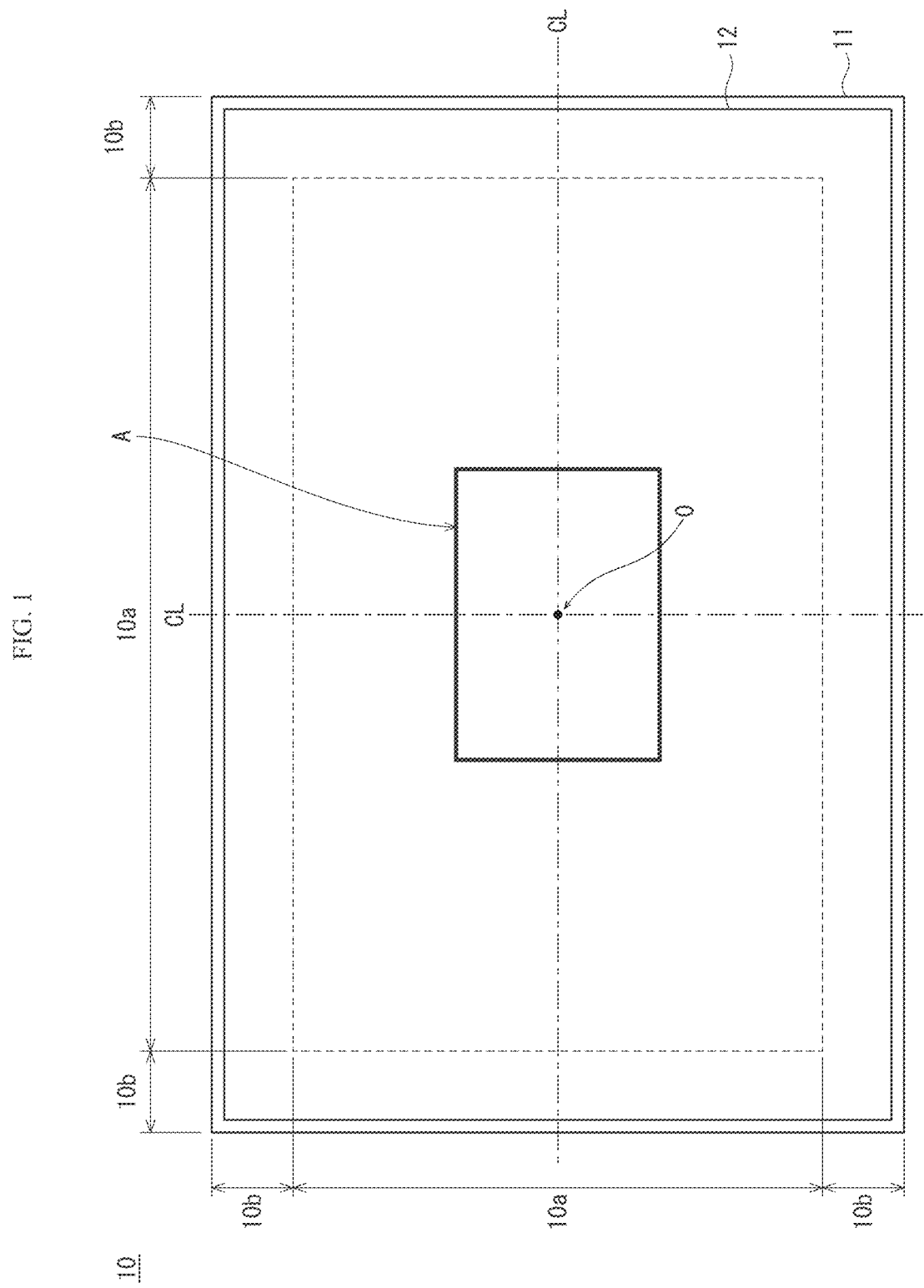
FIG. 1 is a plan view diagram of organic EL display panel 10 according to an embodiment.

<<Background to an Aspect of the Present Disclosure>>

In light emitting element repair, when film thickness of a metal layer forming an electrode becomes thicker, it becomes necessary to increase laser irradiation energy to increase resistance, and there is a problem that a conventional repair technique is insufficient to increase resistance. Further, if an increase in energy required to increase resistance causes metal layer fragments to become scattered inside a repaired light emitting element, this may cause a dead point and a failure to repair.

The present disclosure is made in view of the above problem, and an object of the present disclosure is to provide a self-luminous display panel and a self-luminous display panel manufacturing method that can repair a dead point light emitting element by laser irradiation from outside of a short-circuited portion in a light emitting element to remove or increase resistance when thickness of the metal layer forming the electrode is thick.

The present disclosure is made in view of the above problem, and an object of the present disclosure is to provide a self-luminous display panel and a self-luminous display panel manufacturing method that can repair a dead point light emitting element by laser irradiation from outside of a short-circuited portion in a light emitting element to remove or increase resistance when thickness of the metal layer forming the electrode is thick.

<<Aspect of the Disclosure>>

A self-luminous display panel pertaining to an aspect of the present disclosure is a self-luminous display panel in which self-luminous elements are arranged on a plane, wherein each of the self-luminous elements includes a pair of electrodes, functional layers including a light emitting layer, and a sealing layer. The pair of electrodes face other, and an electrode of the pair of electrodes includes a metal layer. The functional layers are disposed between the pair of electrodes. The sealing layer covers the pair of electrodes and the functional layers from a direction. The self-luminous elements include a repaired self-luminous element that further includes a foreign object among the functional layers. The electrode including the metal layer has a high resistance portion surrounding, in plan view, an area containing the foreign object, and has a thickened portion of the metal layer at an outer edge, in plan view, of the high resistance portion.

This structure can provide a self-luminous display panel that has a structure such that a dead point light emitting element can be repaired by laser irradiation from outside of a short-circuited portion in a light emitting element to remove or increase resistance when thickness of the metal layer forming the electrode is thick. Further, by forming a thickened portion of the metal layer, it is possible to prevent material of the irradiated portion from scattering as debris of material of the metal layer and/or debris of foreign matter in the self-luminous element due to laser irradiation. As a result, it is possible to suppress occurrence of dead points due to repair failure caused by scattered metal layer fragments inside a repaired light emitting element.

According to at least one embodiment, thickness of the metal layer is 20 nm or greater.

According to this structure, even when thickness of the metal layer forming an electrode is thick, for example 20 nm or more, material of a portion of the metal layer irradiated by a laser having a pulse width of picoseconds is melted to increase resistance, forming a high resistance portion.

According to at least one embodiment, the high resistance portion is a ring-shaped portion of the electrode including the metal layer that surrounds the foreign object in plan view.

According to this structure, an electrode including a metal layer has increased electrical resistance between a region including the foreign object and a region surrounding said region in plan view, such that an abnormal organic EL element 2 that was a dead point can be recovered as a repaired self-luminous element.

According to at least one embodiment, thickness of the thickened portion of the metal layer decreases as distance from the high resistance portion increases in plan view.

According to this structure, material of a molten metal layer moved and solidified again, forming a thickened portion of the metal layer in a region surrounding an outer edge of the high resistance portion, such that when material of an irradiated portion is irradiated with a laser, it is possible to prevent debris of material of the metal layer and/or debris of the foreign object scattering inside the self-luminous element.

According to at least one embodiment, the electrode including the metal layer further includes a layer made of a metal oxide.

A self-luminous display panel pertaining to an aspect of the present disclosure is a self-luminous display panel in which self-luminous elements are arranged on a plane, wherein each of the self-luminous elements includes a pair of electrodes, functional layers including a light emitting layer, and a sealing layer. The pair of electrodes face other, and an electrode of the pair of electrodes includes a metal layer. The functional layers are disposed between the pair of electrodes. The sealing layer covers the pair of electrodes and the functional layers from a direction. The self-luminous elements include a repaired self-luminous element that further includes a foreign object among the functional layers. The electrode including the metal layer has a high resistance portion that is a portion of the electrode including the metal layer that contains the foreign object, in plan view, and has a thickened portion of the metal layer at an outer edge, in plan view, of the high resistance portion.

According to at least one embodiment, the high resistance portion is a portion of the electrode including the metal layer that is disposed above the foreign object.

According to this structure, the high resistance portion can be limited to a portion of the electrode including the metal layer above the foreign object, and an area of the high resistance portion can be reduced. This makes it possible to increase a ratio of the light emitting area in the light emitting layer in the repaired self-luminous element.

A method of manufacturing a self-luminous display panel in which self-luminous elements are arranged on a plane is a method including: a process of forming the self-luminous elements on a substrate surface; a process of driving the self-luminous elements to detect an abnormal self-luminous element; and a process of repairing the abnormal self-luminous element. The process of forming the self-luminous elements includes: a sub-process of forming a pair of electrodes disposed facing each other, an electrode of the pair of electrodes including a metal layer; a sub-process of forming functional layers including light emitting layers disposed between the pair of electrodes; and a sub-process of forming a sealing layer that covers the pair of electrodes and the functional layers. The process of repairing the abnormal self-luminous element includes: a process of detecting a position of a foreign object in the abnormal self-luminous element; and a process of forming a high resistance portion in the electrode including the metal layer in the abnormal self-luminous element, where the high resistance portion, in plan view, surrounds an area containing the foreign object. In the process of forming the high resistance portion, a thickened portion of the metal layer close to an outer edge of the high resistance portion is formed.

This method can manufacture a self-luminous display panel in which a dead point light emitting element can be repaired by laser irradiation from outside of a short-circuited portion in the light emitting element to remove or increase resistance when thickness of the metal layer forming the electrode is thick. Further, by forming a thickened portion of the metal layer, it is possible to prevent material of the irradiated portion from scattering as debris of material of the metal layer and/or debris of foreign matter in the self-luminous element due to laser irradiation. As a result, it is possible to suppress occurrence of dead points due to repair failure caused by scattered metal layer fragments inside a repaired light emitting element.

According to at least one embodiment of the method, in the process of forming the high resistance portion, a ring-shaped portion of the electrode including the metal layer that surrounds the foreign object in plan view is irradiated by a laser having a picosecond pulse width.

According to this method, in the organic EL element 2 irradiated with a laser having a pulse width of picoseconds, even when thickness of the metal layer of the electrode is thick, for example 20 nm or more, material of the irradiated portion of the metal layer that is heated to melting to increase resistance and form a high resistance portion. As a result, an electrode including the metal layer has increased electrical resistance between a region including the foreign object and a region surrounding said region in plan view, such that an abnormal organic EL element 2 that was a dead point can be recovered as a repaired self-luminous element in a laser repair process.

According to at least one embodiment of the method, in the process of forming the high resistance portion, the thickened portion is formed by metal in the metal layer being melted by irradiation by a laser having a picosecond pulse width and a portion of the metal layer moving.

According to this method, material of the molten metal layer can move and solidify again, and a thickened portion of the metal layer can be formed in a region surrounding the outer edge of the high resistance portion.

Further, a structure can be realized in which a pixel electrode does not come into contact with the thickened portion that wraps around below the region surrounding the high resistance portion and a deformed functional layer. Even in a self-luminous element in which a distance between a pixel electrode and the counter electrode is small, resistance of the counter electrode can be increased and a dead point can be recovered.

According to at least one embodiment of the method, thickness of the metal layer is 20 nm or greater.

According to this method, even when thickness of the metal layer forming an electrode is thick, material of a portion of the metal layer irradiated by a laser having a pulse width of picoseconds is melted to increase resistance, forming a high resistance portion.

According to at least one embodiment of the method, the electrode including the metal layer further includes a metal oxide layer.

A method of manufacturing a self-luminous display panel in which self-luminous elements are arranged on a plane is a method including: a process of forming the self-luminous elements on a substrate surface; a process of driving the self-luminous elements to detect an abnormal self-luminous element; and a process of repairing the abnormal self-luminous element. The process of forming the self-luminous elements includes: a sub-process of forming a pair of electrodes disposed facing each other, an electrode of the pair of electrodes including a metal layer; a sub-process of forming functional layers including light emitting layers disposed between the pair of electrodes; and a sub-process of forming a sealing layer that covers the pair of electrodes and the functional layers. The process of repairing the abnormal self-luminous element includes: a process of detecting a position of a foreign object in the abnormal self-luminous element; and a process of forming a high resistance portion in the electrode including the metal layer in the abnormal self-luminous element, where the high resistance portion, in plan view, contains an area containing the foreign object. In the process of forming the high resistance portion, a thickened portion of the metal layer close to an outer edge of the high resistance portion is formed.

According to at least one embodiment of the method, in the process of forming the high resistance portion, the portion of the electrode including the metal layer that contains the foreign matter in plan view is irradiated by a laser having a picosecond pulse width.

According to this method, the high resistance portion can be limited to a portion of the electrode including the metal layer above the foreign object, and an area of the high resistance portion can be reduced. This makes is possible to increase a ratio of the light emitting area in the light emitting layer in the repaired self-luminous element.

Embodiments

<Overview of Organic EL Display Panel 10>

The following describes an organic EL element, an organic EL display panel, and an organic EL display device according to an aspect of the present disclosure, with reference to the drawings. The drawings include schematic diagrams and might not be drawn to scale.

<Overall Structure of Organic EL Display Panel 10>

The organic EL display panel 10 (hereinafter also referred to as "display panel 10") is a top emission type of display panel according to the present embodiment, in which organic EL elements (not illustrated) are arranged across an image display face, and light emission of organic EL elements is combined to display an image.

FIG. 1 is a plan view diagram of the display panel 10 according to Embodiment 1. The display panel 10 is an organic EL display panel that utilizes electroluminescence of organic material, in which organic EL elements are arranged in a matrix, for example on a top surface of a planarizing layer 12 on a substrate 11. As illustrated, the display panel 10, in plan view, is divided into a central area 10a corresponding to a defined range including a center O of a face of the substrate 11 and a peripheral area 10b around the central area 10a of the face of the substrate 11. Here, dimensions of the central area 10a in the X and Y directions of the substrate 11 may be, for example, from 50% to 90% of dimensions in the X and Y directions of the display panel 10. Further, in the substrate 11, dimensions of the peripheral area 10b in the X and Y dimensions may be, for example, from 5% to 25% of dimensions in the X and Y dimensions of the display panel 10, in an X or Y direction with respect to center lines CL.

(A) Plan View Structure

Figure 2:
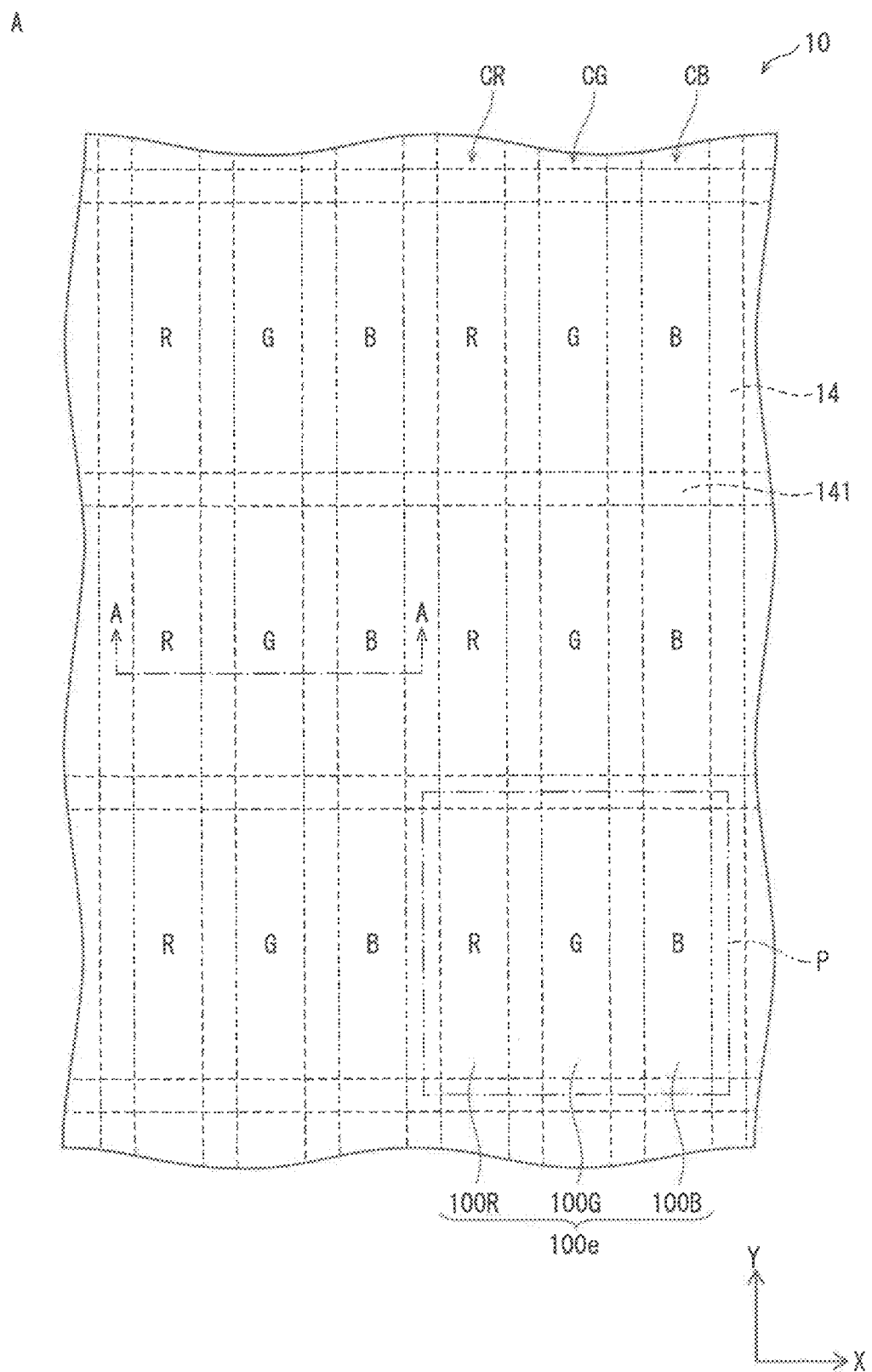
FIG. 2 is a schematic plan view enlargement of a portion of an image display face of organic EL display panel 10.

FIG. 2 is a schematic plan view enlargement of portion A of the image display face of the organic EL display panel 10. In the organic EL display panel 10, as an example, sub-pixels 100R, 100G, and 100B that emit red, green, and blue light, respectively (hereinafter also referred to as R, B, and B) are arranged in a matrix of columns and rows. The sub-pixels 100R, 100G, 100B repeat in this order in the X direction, and a set of one each of the sub-pixels 100R, 100G, 100B lined up in the X direction constitute one pixel P. In one pixel P, it is possible to express a full color range by combining emitted luminance of the sub-pixels 100R, 100G, 100B whose gradation is controlled.

Further, in the Y direction, sub-pixel columns CR, CG, CB each include only the sub-pixels 100R, 100G, or 100B, respectively. As a result, the pixels P of the organic EL display panel 10 as a whole are arranged in a matrix along the X and Y direction, and an image is displayed on the image display face by combining colors of the pixels P arranged in the matrix.

Organic EL elements 2(R), 2(G), 2(B) (hereinafter sometimes referred to as "organic EL elements 2") that emit R, G, B color light, respectively, are arranged in the sub-pixels 100R, 100G, 100B (hereinafter sometimes referred to as "sub-pixels 100").

Further, the organic EL display panel 10 according to the present embodiment employs a link bank structure. That is, banks 14 partition the sub-pixel columns CR, CG, CB in the X direction, and in each of the sub-pixel columns CR, CG, CB, the sub-pixels 100R, 100G, or 100B in the sub-pixel column share a common organic light emitting layer.

However, in each of the sub-pixel columns CR, CG, CB are pixel regulation layers 141 at intervals in the Y direction that insulate the sub-pixels 100R, 100G, 100B from each other, such that the sub-pixels 100R, 100G, 100B can each emit light individually.

(B) Cross Section Structure

FIG. 3 is a cross section diagram of the organic EL display panel 10 taken along line A-A of FIG. 2. In the organic EL display panel 10, one pixel is composed of three sub-pixels that emit R, G, B light, respectively, and each sub-pixel is composed of a corresponding one of the organic EL elements 2(R), 2(G), 2(B). The organic EL elements 2(R), 2(G), 2(B) essentially have almost the same structure as each other, and hereinafter are also referred to as organic EL elements 2 when not distinguished.

As illustrated in FIG. 3, the organic EL elements 2 include the substrate 11, the planarizing layer 12, pixel electrodes 13 (anode), the banks 14, hole injection layers 15, hole transport layers 16, organic light emitting layers 17, an electron transport layer 18, an electron injection layer 19, a counter electrode 20 (cathode), and a sealing layer 21. Of these, the hole injection layers 15, the hole transport layers 16, the organic light emitting layers 17, the electron transport layer 18, and the electron injection layer 19 that are sandwiched between the pixel electrodes 13 and the counter electrode 20 constitute functional layers of the organic EL elements 2.

The substrate 11, the planarizing layer 12, the electron transport layer 18, the electron injection layer 19, the counter electrode 20, and the sealing layer 21 are not specific to each pixel and are common to a plurality of the organic EL elements 2 of the organic EL display panel 10.

(Substrate)

The substrate 11 includes a base 111 of an insulating material and a thin film transistor (TFT) layer 112. A drive circuit is formed in the TFT layer 112 for each sub-pixel. As the base 111, for example, a glass substrate, a quartz substrate, a silicon substrate, a metal substrate such as molybdenum sulfide, copper, zinc, aluminum, stainless steel, magnesium, iron, nickel, gold, silver, or the like, a semiconductor substrate such as gallium arsenide, a plastic substrate, or the like can be used.

As a plastic material, either a thermoplastic resin or a thermosetting resin may be used. For example, polyethylene, polypropylene, polyamide, polyimide (PI), polycarbonate, acrylic resin, polyethylene terephthalate (PET), polybutylene terephthalate, polyacetal, other fluororesins, various thermoplastic elastomers such as styrene, polyolefin, polyvinyl chloride, polyurethane, fluororubber, and chlorinated polyethylene based elastomers, epoxy resin, unsaturated polyester, silicone resin, polyurethane, and the like, or copolymers, blends, polymer alloys, or the like that are mainly composed of these, or a laminate of one or more of these can be used.

In order to manufacture a flexible organic EL display panel, it is desirable that the substrate is a plastic material.

(Planarizing Layer)

The planarizing layer 12 is formed on the substrate 11. The planarizing layer 12 is made of a resin material and is for planarizing steps on an upper surface of the TFT layer 112. Examples of the resin material include positive photosensitive material. Further, as such a photosensitive material, an acrylic resin, a polyimide resin, a siloxane resin, or a phenol resin can be used. Further, although not illustrated in the cross section view of FIG. 3, contact holes are formed in the planarizing layer 12 in one-to-one correspondence with sub-pixels.

(Pixel Electrodes)

The pixel electrodes 13 each include a metal layer made of a light reflective material, and are formed on the planarizing layer 12. The pixel electrodes 13 are provided in one-to-one correspondence with sub-pixels, and are electrically connected to the TFT layer 112 through contact holes (not illustrated). According to the present embodiment, the pixel electrodes 13 function as anodes.

Specific examples of metal material having light reflectivity include silver (Ag), aluminum (Al), aluminum alloy, molybdenum (Mo), alloy of silver, palladium, and copper (APC), alloy of silver, rubidium, and gold (ARA), and the like. The pixel electrodes 13 may each be composed of a single metal layer, or may be a laminated structure in which a layer made of metal oxide such as indium tin oxide (ITO) or indium zinc oxide (IZO) is laminated on a metal layer.

(Banks, Pixel Regulation Layers)

The banks 14 have line bank shapes extending in the Y direction between the sub-pixel columns CR, CG, CB arranged along the X direction, partitioning in the X direction the pixel electrodes 13 arranged in a one-to-one correspondence with sub-pixels above the substrate 11. An electrically insulative material is used in the banks 14. As specific examples of the electrically insulative material, an insulating organic material may be used (for example, acrylic resin, polyimide resin, novolac resin, phenol resin, or the like).

The banks 14 function as structures for preventing colors of ink from overflowing and mixing when the organic light emitting layers 17 are formed by an ink application method. When a resin material is used, from the viewpoint of processability, it is preferable that the resin material have photosensitivity. The banks 14 preferably have organic solvent resistance and heat resistance. Further, in order to suppress ink overflow, it is preferable that surfaces of the banks 14 have a defined liquid repellency.

The pixel regulation layers 141 are made of an electrically insulative material, cover ends of the pixel electrodes 13 in the Y direction in the sub-pixel columns (FIG. 2), and partition the pixel electrodes 13 from each other in the Y direction. The pixel regulation layers 141 have roles in suppressing discontinuity of organic light emitting layers 17 in each of the sub-pixel columns CR, CG, CB, and improving electrical insulation between the pixel electrodes 13 and the counter electrode 20.

Film thickness of the pixel regulation layers 141 is set to be smaller than a top surface of the organic light emitting layers 17 in an ink state, but larger than a top surface of the organic light emitting layers 17 after drying. As a result, each of the organic light emitting layers 17 in the sub-pixel columns CR, CG, CB is not partitioned by the pixel regulation layers 141, and flow of ink is not hindered within the sub-pixel columns CR, CG, CB when forming the organic light emitting layers 17. This facilitates making the thickness of the organic light emitting layers 17 in each sub-pixel column uniform.

(Hole Injection Layers)

The hole injection layers 15 are provided on the pixel electrodes 13 for the purpose of promoting injection of holes from the pixel electrodes 13 to the organic light emitting layers 17. The hole injection layers 15 may be an oxide of a metal such as silver (Ag), molybdenum (Mo), chromium (Cr), vanadium (V), tungsten (W), nickel (Ni), or iridium (Ir), a low molecular weight organic compound such as copper phthalocyanine (CuPc), or a high molecular weight material such as polyethylene dioxythiophene polystyrene sulfonate (PEDOT: PSS).

(Hole Transport Layers)

The hole transport layers 16 have a function of transporting holes injected from the hole injection layers 15 to the organic light emitting layers 17. Further, the hole transport layers 16 function as a base layer for the organic light emitting layers 17 described later, and have a structure including an organic compound. The hole transport layers 16 may be composed of, for example, an arylamine derivative, a fluorene derivative, a Spiro derivative, a carbazole derivative, a pyridine derivative, a pyrazine derivative, a pyrimidine derivative, a triazine derivative, a quinoline derivative, a phenanthroline derivative, a phthalocyanine derivative, a porphyrin derivative, a silole derivative, an oligothiophene derivative, a condensed polycyclic aromatic derivative, a metal complex, or the like, a high molecular weight compound such as a polymer, a low molecular weight compound such as a monomer, or may be formed by a wet process such as application using an ink in which a high or low molecular weight compound is dissolved in a solvent.

(Organic Light Emitting Layers)

The organic light emitting layers 17 are formed in apertures 14a, and have a function of emitting R, G, B light via recombination of holes and electrons. In particular, where it is necessary to specify light emission color, the organic light emitting layers 17 are indicated by 17(R), 17(G), 17(B).

According to the present embodiment, the organic light emitting layers 17 each have a structure of an applied film formed by applying an ink containing an organic light emitting material and a defined solvent onto a base layer, then drying the ink. As an organic light emitting material used in the organic light emitting layers 17, examples include a fluorescent substance such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group III metal, metal complex of oxine, rare earth metal complex, or a phosphorescent substance such as a metal complex that emits phosphorescence such as tris(2-phenylpyridine) iridium.

Further, an organic light emitting material may be a high molecular weight compound such as polyfluorene or a polyfluorene derivative, polyphenylene or a polyphenylene derivative, or a mixture of a low molecular weight compound and a high molecular weight compound.

(Electron Transport Layer)

The hole transport layers 18 have a function of transporting electrons from the counter electrode 20 to the organic light emitting layers 17. An example of an organic material used for the electron transport layer 18 is a $\pi$ electron low molecular weight organic material such as an oxadiazole derivative (OXD), a triazole derivative (TAZ), a phenanthroline derivative (BCP, Bphen), or the like.

(Electron Injection Layer)

The electron injection layer 19 has a function of injecting electrons supplied from the counter electrode 20 towards the organic light emitting layers 17. The electron injection layer 19 is made of an organic material that has high electron transportability, doped with a metal selected from alkali metals and alkaline earth metals such as lithium (Li), sodium (Na), potassium (K), calcium (Ca), barium (Ba), or the like.

An example of an organic material used for the electron injection layer 19 is a $\pi$ electron low molecular weight organic material such as an oxadiazole derivative (OXD), a triazole derivative (TAZ), a phenanthroline derivative (BCP, Bphen), or the like.

(Counter Electrode)

The counter electrode 20 is made of a light transmissive electrically conductive material, and is formed on the electron injection layer 19. The counter electrode 20 functions as a cathode.

The counter electrode 20 may include a metal layer 20A and may further include a metal oxide layer 20B as an upper layer of the metal layer 20A. The counter electrode 20 faces the pixel electrodes 13 to form energization paths sandwiching the organic light emitting layers 17, and supplies carriers to the organic light emitting layers 17, for example when the counter electrode 20 functions as a cathode it supplies electrons to the organic light emitting layers 17.

As the metal layer 20A, for example a metal thin film can be used. In order to more effectively obtain an optical resonator structure, as a material of the counter electrode 20, a metal thin film is preferably formed from at least one material selected from aluminum, magnesium, silver, aluminum lithium alloy, magnesium silver alloy, and the like. In this case, film thickness of the metal thin film is preferably from 20 nm to 50 nm. As a result, the counter electrode 20 is light transmissive, and an optical resonator structures can be constructed between reflective surfaces of the pixel electrodes 13 and the counter electrode 20, so that luminance efficiency can be further improved.

Further, as the metal oxide layer 20B on the metal layer 20A, a light transmissive electrically conductive film such as indium tin oxide (ITO) or indium zinc oxide (IZO) is formed, so that chromaticity and viewing angle can be adjusted.

In order to secure optical path length of an optical resonator structure, a light transmissive electrically conductive film of ITO, IZO, or the like may be formed between the electron injection layer 19 and the counter electrode 20 having a desired film thickness to adjust the optical distance between the organic light emitting layer 17 and the counter electrode 20 to an appropriate size.

(Sealing Layer)

The sealing layer 21 is provided to prevent organic layers such as the hole transport layers 16, the organic light emitting layers 17, the electron transport layer 18, and the like from being deteriorated due to exposure to external moisture or air.

The sealing layer 21 is formed using, for example, a light-transmissive material such as silicon nitride (SiN), silicon oxynitride (SiON), or the like.

(Other Elements)

Although not illustrated in FIG. 3, a polarizing plate for antiglare or an upper substrate may be attached onto the sealing layer via a light transmissive adhesive. Further, a color filter for correcting chromaticity of light emitted by each organic EL element 2 may be attached. As a result, the hole transport layers 16, the organic light emitting layers 17, the electron injection layer 19, and the like can be further protected from external moisture, air, and the like.

<Organic EL Element Repair>

In the display panel 10, a foreign object FO may be mixed in between one of the pixel electrodes 13 (anode) and the counter electrode 20 (cathode) of one of the organic EL elements 2 in manufacturing, which causes a dead point due to a short circuit between the pixel electrode 13 and the counter electrode 20, resulting in an abnormal organic EL element 2.

The foreign object FO contains a conductive material other than the constituent material of the functional layer, and is mainly composed of a metal particle such as iron, aluminum, or stainless steel. In such a case, repair is performed to recover the abnormal organic EL element 2 that has become a dead point by removing or increasing the resistance of the short circuited portion in the abnormal organic EL element 2 by irradiating it with a laser from outside. In the present specification, the abnormal organic EL element 2 after repair may be referred to as a repaired organic EL element 2'.

Figure 4A:
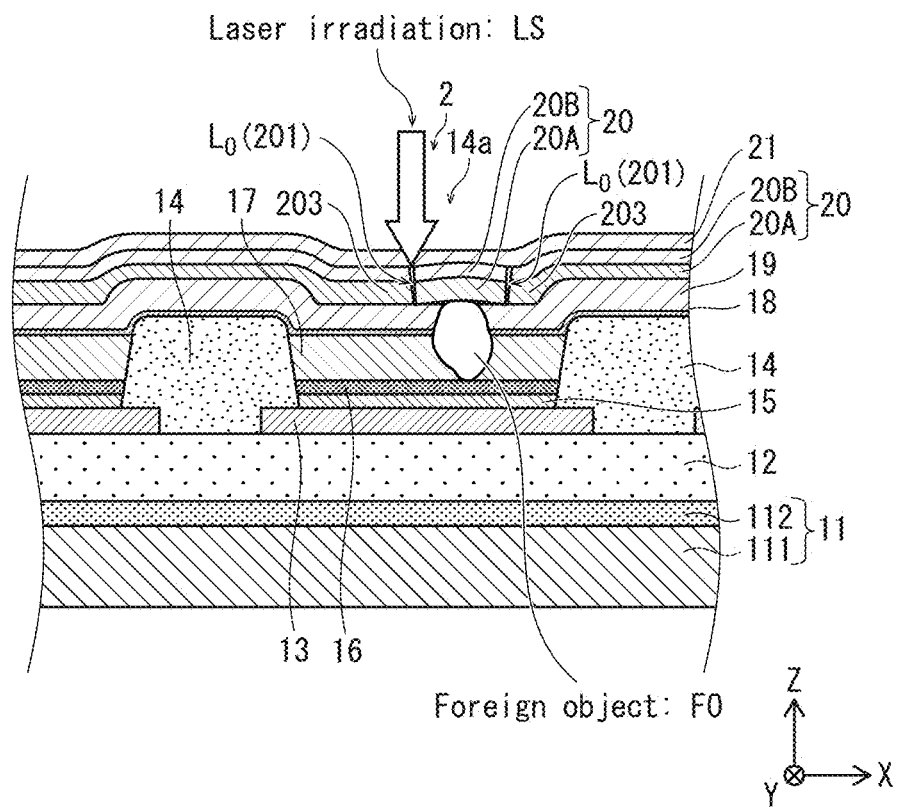
FIG. 4A is a schematic cross section diagram illustrating an outline of a repair process in manufacture of organic EL element 2.
Figure 4B:
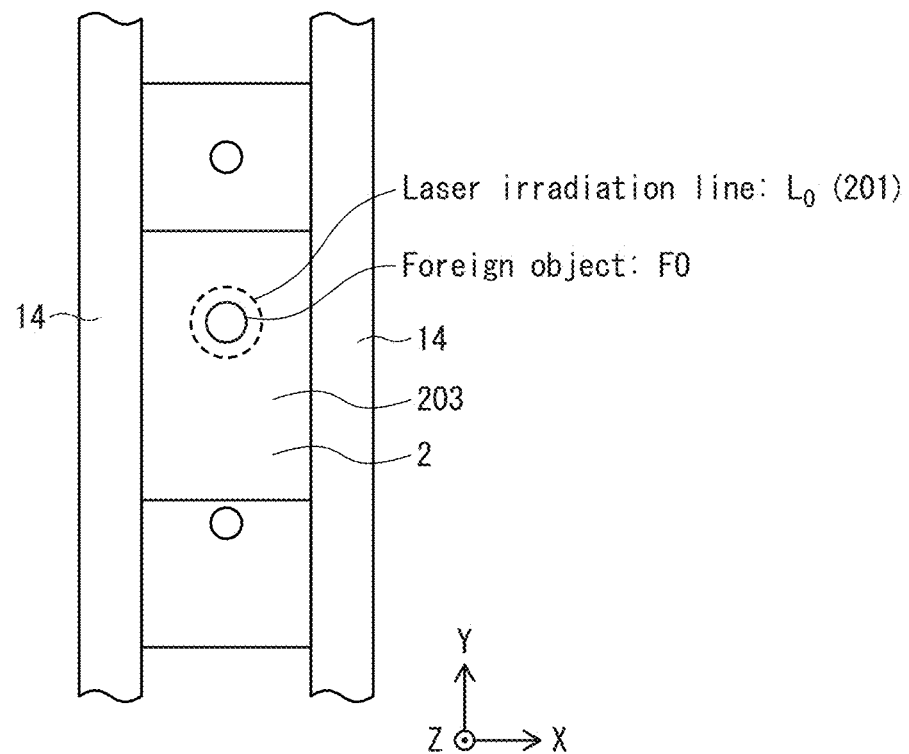
FIG. 4B is a schematic plan view diagram of same.

FIG. 4A is a schematic cross section diagram illustrating an outline of a repair process in manufacture of the organic EL element 2, and FIG. 4B is a schematic plan view diagram of same.

As illustrated in FIG. 4A, 4B, when the foreign object FO is present in any of the functional layers 15, 16, 17, 18, 19 (hereinafter also referred to as functional layers 15-19) of the abnormal organic EL element 2, a laser having a pulse width of picoseconds irradiates a circumferential portion L0 (indicated by a laser irradiation line) of the counter electrode 20 including the metal layer 20A, surrounding the foreign object FO in plan view. As a result, the circumferential portion L0 of the counter electrode 20 irradiated by the laser increases in resistance, forming a high resistance portion 201. That is, in plan view, the high resistance portion 201 is formed that increases electrical resistance between the foreign object FO and an area 203 surrounding an area in L0 that contains the foreign object FO, in the counter electrode 20 including the metal layer 20A in the abnormal organic EL electrode 2.

Figure 5:
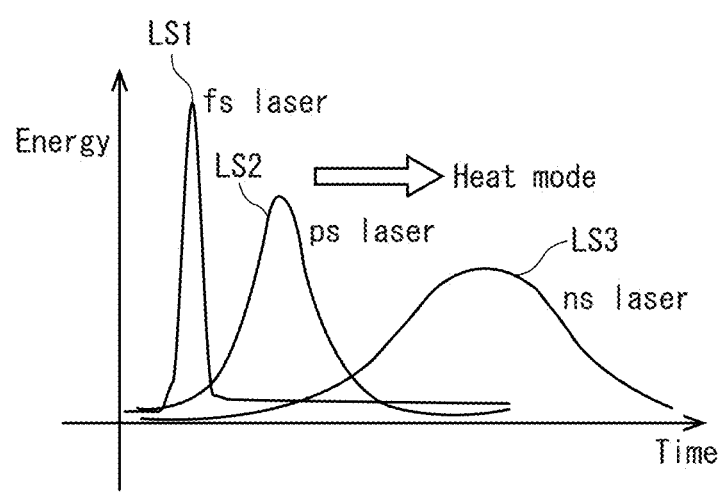
FIG. 5 is a diagram illustrating laser irradiation time relative to irradiation energy in a repair process.

FIG. 5 is a diagram illustrating laser irradiation time relative to irradiation energy in a repair process.

Laser irradiation in the repair process is mainly classified depending on applied pulse width into a femtosecond (fs) laser LS1 with a pulse width of less than 1 ps, a picosecond (ps) laser LS2 with a pulse width selected from a range from 1 ps to less than 1000 ps, and a nanosecond (ns) laser LS3 with a pulse width from 1000 ps to less than 1000 ns. As illustrated in FIG. 5, applied pulse width decreases and applied energy per unit time increases in an order from nanosecond laser LS3, picosecond laser LS2, and femtosecond laser LS1. In laser irradiation in the repair process, when the femtosecond laser LS1 is used, the irradiated portion of material is made highly resistant by multiphoton absorption, whereas when the picosecond laser LS2 or the nanosecond laser LS3 is used, the irradiated portion of material is mainly melted by heat to become highly resistant.

Figure 6A:
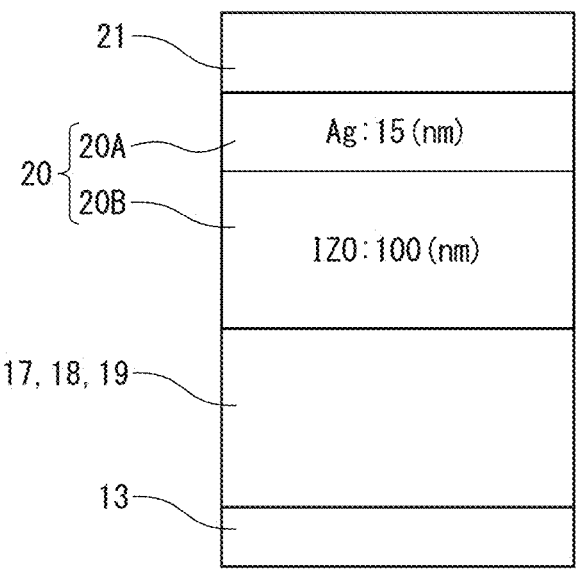
FIG. 6A is a schematic cross section view diagram illustrating a laminated structure of an organic EL element according to a reference example.
Figure 6B:
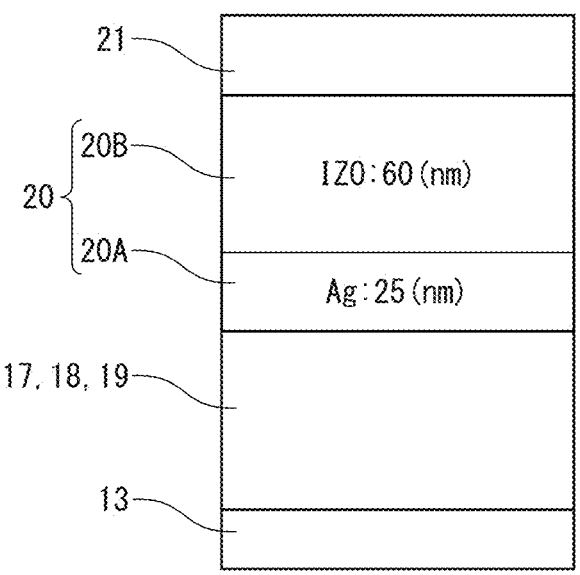
FIG. 6B is a schematic cross section view diagram illustrating a laminated structure of organic EL element 2.

FIG. 6A is a schematic cross section view diagram illustrating a laminated structure of an organic EL element according to a reference example. FIG. 6B is a schematic cross section view diagram illustrating a laminated structure of the organic EL element 2. FIG. 6A illustrates a structure according to a reference example in which the upper layer is the metal layer 20A made of silver having a thickness of 15 nm, and the lower layer is the metal oxide layer 20B made of IZO having a thickness of 100 nm. With respect to this structure, a femtosecond laser is used for laser irradiation in the repair process.

FIG. 6B illustrates a structure of the organic EL element 2 according to an embodiment in which the metal layer 20A is made of silver having a thickness of 25 nm, and the metal oxide layer 20B is made of IZO having a thickness of 60 nm. With respect to this structure, the picosecond laser LS2 is used for laser irradiation in the repair process.

Figure 7A:
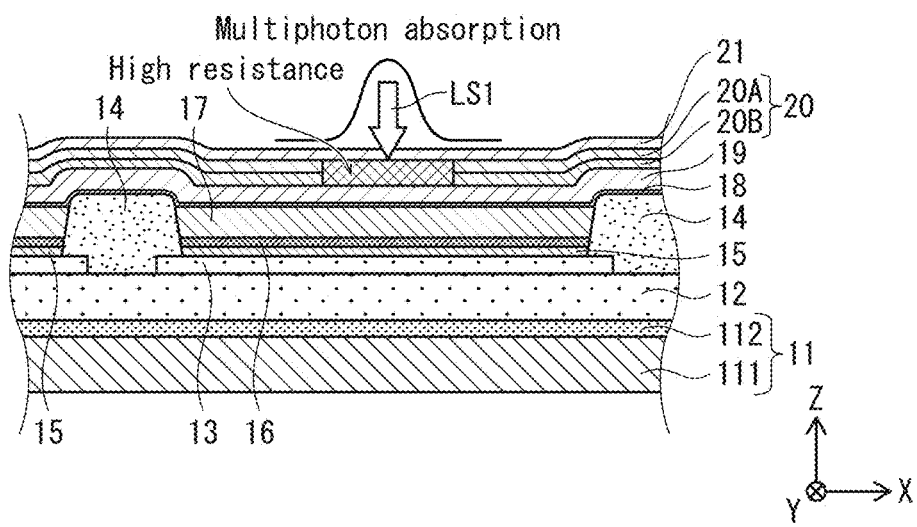
FIG. 7A, 7B, 7C are schematic cross section view diagrams illustrating an outline of processing when laser irradiation conditions are changed in a repair process.
Figure 7B:
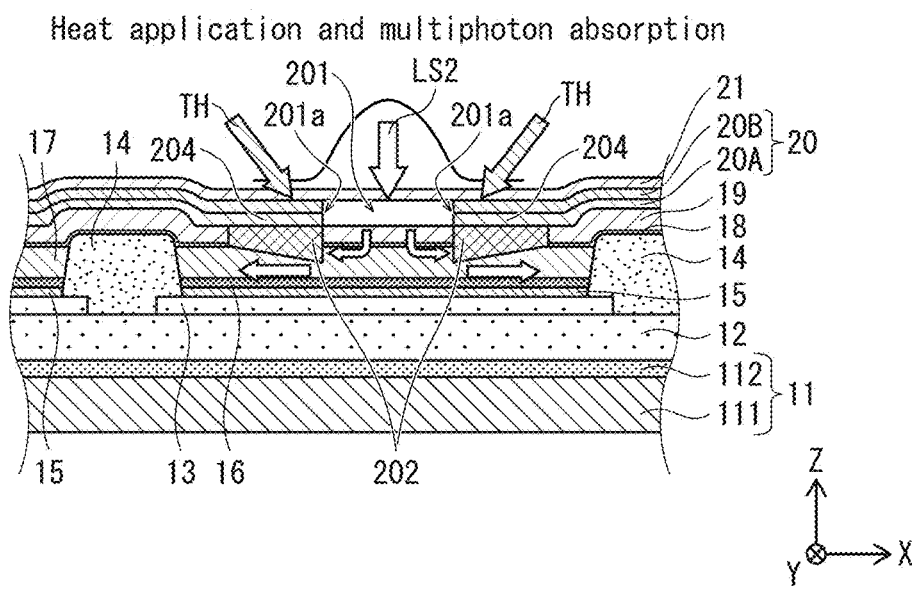
Figure 7C:
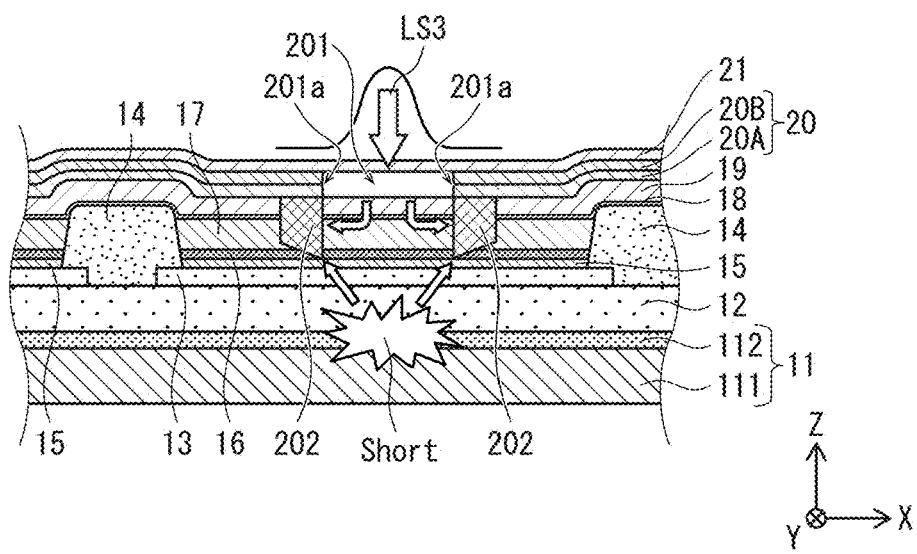

FIG. 7A, 7B, 7C are schematic cross section diagrams illustrating an outline of processing when laser irradiation conditions are changed in the repair process. FIG. 7A illustrates a conventional structure using the femtosecond laser LS1, FIG. 7B illustrates the organic EL element 2 according to an embodiment using the picosecond laser LS2, and FIG. 7C illustrates a reference example structure using the nanosecond laser LS3.

As illustrated in FIG. 7A, in the structure of the reference example in which the metal layer 20A is silver having a thickness of 15 nm, the femtosecond laser LS1 is used to increase resistance of the irradiated portion of the layer 20B of IZO by multiphoton absorption, and heat transferred from the layer 20B of IZO and comminution of IZO also causes an increase in resistance of the layer 20A of silver.

In contrast, in the structure pertaining to the organic EL element 2 in which the metal layer 20A of silver has a thickness of 25 nm, the effect of the increase in resistance of IZO by multiphoton absorption via the femtosecond laser LS1 does not sufficiently increase resistance of adjacent silver. Therefore, the picosecond laser LS2, for which pulse width is selected from the range from 1 ps to less than 1000 ps, is used to increase resistance of the irradiated portion.

As a result, in the organic EL element 2 irradiated by the picosecond laser LS2, as illustrated in FIG. 7B, even when thickness of the metal layer 20A forming the electrode is thick, for example 20 nm or more, material of the irradiated portion of the electrode 20 is melted and/or moved by heat TH to increase resistance and form a high resistance portion 201. By using the picosecond laser LS2, there is no risk that applied energy is too great, which could lead to the metal layer 20A and/or the metal oxide layer 20B before high resistance formation short circuiting with the pixel electrode 13, or the pixel electrode 13 being damaged leading to a malfunction such that the sub pixel cannot emit light.

At the same time, material of the metal layer 20A and/or the metal oxide layer 20B while molten moves then solidifies again, so that a thickened portion 202 (a portion which thickness of the metal layer 20A is increased and protrudes) of the metal layer 20A and/or the metal oxide layer 20B is formed in an area 204 in the vicinity of an outer edge 201a of the high resistance portion 201. The metal layer 20A of the area 204 in the vicinity of the outer edge 201a of the high resistance does not melt, but any of the functional layers 15-19 below the area 204 may be deformed by influence of heat TH of the picosecond laser LS2, and the molten high resistance portion 201 of the metal layer 20A and/or the metal oxide layer 20B wraps under the area 204. As a result, a structure can be realized in which the pixel electrode 13 does not come into contact with the thickened portion 202 made of molten metal of the high resistance portion that wraps around below the area 204 and the deformed functional layers 15-19.

Further, the area of the high resistance portion 201 and the area irradiated by the picosecond laser LS2 are preferably equal to each other. The area of the counter electrode 20 and the functional layers 15-19 affected by heat is greater than the area of the high resistance portion 201.

As a result, the molten material of the metal layer 20A and/or the metal oxide layer 20B moves and solidifies again, and by forming the thickened portion 202 of the metal layer 20A in the area 204 close the outer edge 201a of the high resistance portion 201, scattering of fragments of material of the metal layer 20A in the organic EL element 2 due to laser irradiation of the irradiated portion can be suppressed.

Further, even in the organic EL element 2 in which distance between the pixel electrode 13 and the counter electrode 20 is narrow, resistance of the counter electrode 20 can be increased and a dead point can be recovered.

On the other hand, as illustrated in FIG. 7C, in the organic EL element 2 irradiated by the nanosecond layer LS3 having a pulse width of 1000 ps or more, a point in common with FIG. 7B is that material of the irradiated portion of the metal layer 20A and/or the metal oxide layer 20B is melted by heat to increase resistance and form the high resistance portion 201, and molten material of the metal layer 20A and/or the metal oxide layer 20B moves and solidifies again to form the thickened portion 202 of the outer edge 201a of the high resistance portion 201.

However, the heat effect applied by the nanosecond laser LS3 is large, movement of molten material of the metal layer 20A and/or the metal oxide layer 20B becomes excessive, the thickened portion 202 of the metal layer 20A becomes thick, and there is a risk of electrical short-circuiting due to contact with the pixel electrode 13. That is, the nanosecond laser LS3 has an excessive range of heat processing.

Figure 8A:
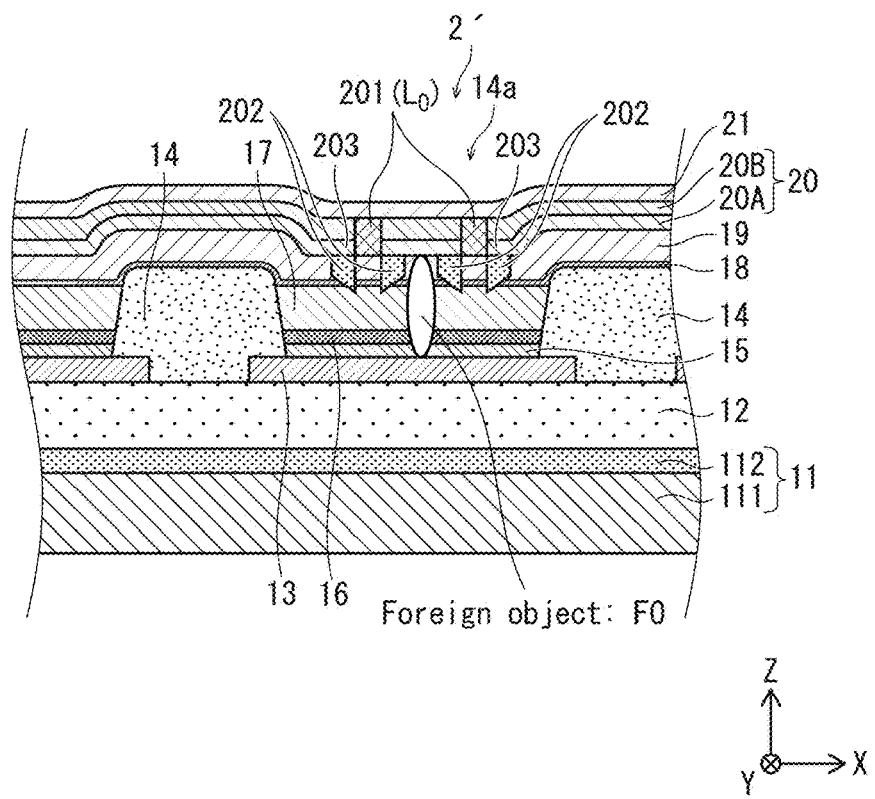
FIG. 8A is a schematic cross section view diagram illustrating a laminated structure of repaired organic EL element 2' in display panel 10.
Figure 8B:
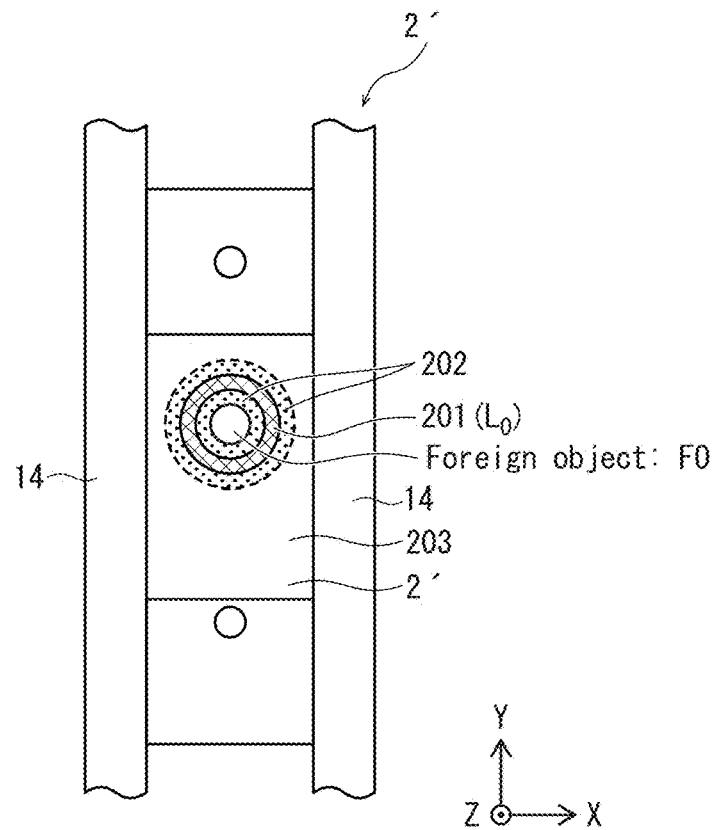
FIG. 8B is a plan view diagram of same.

FIG. 8A is a schematic cross section view diagram illustrating a laminated structure of the repaired organic EL element 2' in the display panel 10, and FIG. 8B is a plan view diagram of same.

As illustrated in FIG. 8A, 8B, a foreign object FO is present in at least one of the functional layers 15-19 of the repaired organic EL element 2', and in plan view, in a ring shaped portion of the counter electrode 20 including the metal layer 20A that surrounds the foreign object FO, a ring shaped portion L0 of the counter electrode 20 irradiated with the picosecond laser LS2 has increased resistance and becomes the high resistance portion 201. Further, the metal oxide layer 20B in contact with the metal layer 20A also becomes the high resistance portion 201.

Thus, in plan view, the high resistance portion 201 is formed that increases elegy resistance between the foreign object FO and the area 203 surrounding the area L0 that contains the foreign object FO, in the counter electrode 20 including the metal layer 20A in the abnormal organic EL element 2.

Further, the thickened portion 202 of the metal layer 20A formed by molten material of the metal layer 20A and/or the metal oxide layer 20B moving and solidifying is formed in the outer edge 201a of the high resistance portion 201.

If fragments of the metal layer 20A are scattered in the repaired organic EL element 2', it can cause a dead point and repair failure, but according to the organic EL element 2 pertaining to an embodiment, the presence of scattered fragments of the metal layer 20A in the repaired organic EL element 2' can be suppressed, to reduce repair defects.

<Method of Manufacturing Organic EL Display Panel>

The following describes a method for manufacturing a top-emission type of organic EL display panel according to an aspect of the present disclosure with reference to FIG. 9 through FIG. 15D.

Figure 9:
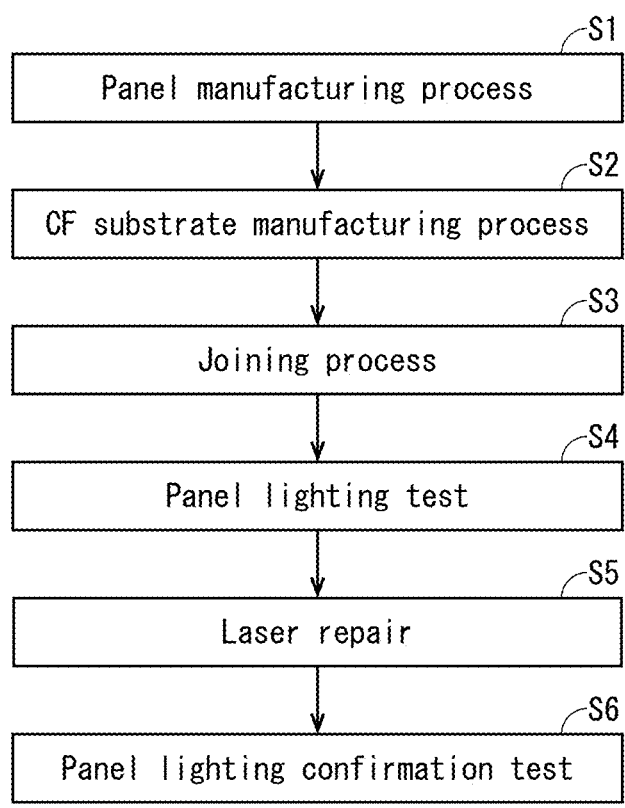
FIG. 9 is a flowchart illustrating an outline of manufacture of organic EL display panel 10.

FIG. 9 is a flowchart illustrating an outline of manufacture of the organic EL display panel 10.

First, a back panel is manufactured in a panel manufacturing process (step S1). Details of back panel manufacturing are described later.

Next, the CF substrate is manufactured in a substrate manufacturing process (step S2).

Here, first, a light transmissive upper substrate is prepared, a light-shielding layer material mainly composed of an ultraviolet curable resin material and a black pigment is applied to a surface of the upper substrate, then exposed using a pattern mask and developed, to form a light-shielding layer having a defined pattern and cross section shape.

Next, a material of a color filter layer containing an ultraviolet curable resin component as a main component is applied to an upper substrate surface on which the light-shielding layer is already formed, then exposure using a defined pattern mask and developing is performed to form a color filter layer having a defined pattern. This process is repeated for color filter materials of each color to form an RGB color filter layer.

Next, the CF substrate and the back panel are joined in a joining process (step S3).

Here, material of a bonding layer containing an ultraviolet curable resin as a main component is applied to the back panel composed of each layer up to the sealing layer, the applied material is irradiated with ultraviolet rays, and the back panel and the CF substrate are joined such that they are aligned and gas does not enter between them. Subsequently, when both panels are baked and a sealing process is completed, the display panel 10 is completed.

Next, in a panel lighting test (step S4), the display panel 10 is connected to a drive circuit, current is passed through the organic EL elements 2, and whether or not the organic EL elements 2 in the display panel 10 are lit normally is tested.

Next, in a laser repair process (step S5), the display panel 10 is connected to a drive circuit, current is passed through the organic EL elements 2, whether or not the organic EL elements 2 in the display panel 10 are lit normally is tested, and presence or absence of abnormal organic EL elements 2 judged to be dead points is determined. When an abnormal organic EL element 2 is detected, the image is taken and a position of the abnormal organic EL element 2 is stored.

Figure 10:
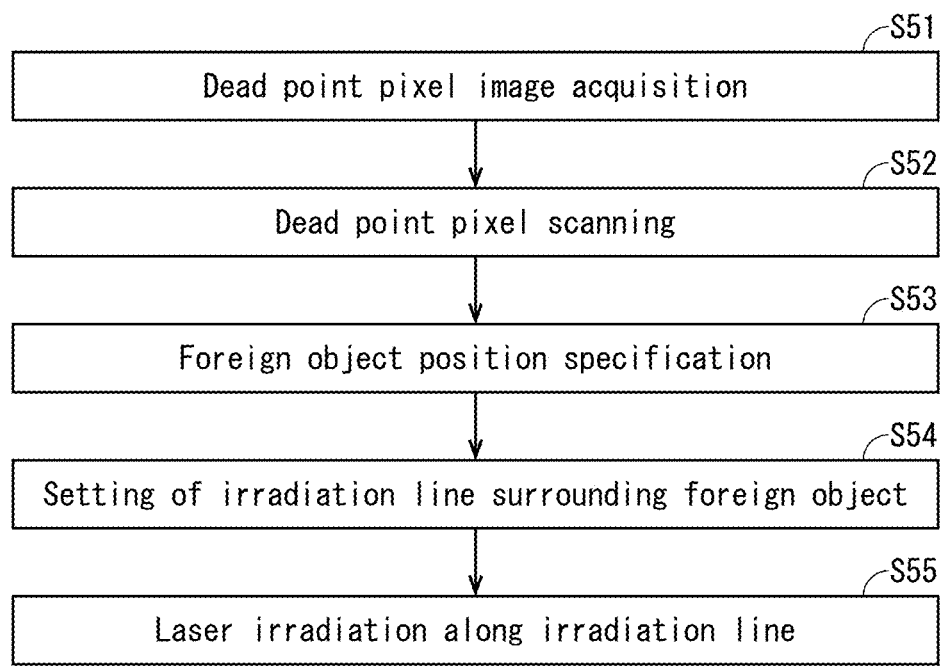
FIG. 10 is a flowchart illustrating an outline of laser repair process S5 in FIG. 9.

FIG. 10 is a flowchart illustrating an outline of the laser repair process S5 in FIG. 9.

In the laser repair process S5, first, an image is taken of the organic EL element 2 in a non-lit state judged to be a dead point in the panel lighting test (step S4) (step S51). In the present specification, the image is also referred to as a dead point element image.

Next, the dead point element image is, for example, scanned in the X, Y directions (step S52), to specify position of a foreign object image on the dead point element image (step S53). The foreign object image appears as a dead point element image, and therefore the foreign object image can be specified by detecting a position of a black point of defined size in the dead point element image.

Next, an irradiation line is set, surrounding the foreign object image (step S54). For example, using a center position of the foreign object image as a reference, a circle having a diameter equal to or greater than diameter of the foreign object or a maximum value of a diagonal line through the foreign object is set as an irradiation line.

Next, the abnormal organic EL element 2 is irradiated by a laser having a pulse width of picoseconds along the irradiation line set based on the dead point element image (step S55). Specifically, as illustrated in FIG. 8A and FIG. 8B, with respect to the abnormal organic EL element 2, the ring shaped portion L0 of the counter electrode 20 including the metal layer 20A, surrounding the foreign object FO in plan view, is irradiated by a laser having a pulse width of picoseconds.

Thus, in the counter electrode 20 including the metal layer 20A in the abnormal organic EL element 2, in plan view, the high resistance portion 201 that has increased electrical resistance is formed between the foreign object FO and the area 203 surrounding the area containing the foreign object FO.

[Laser Processing]

A laser processing device includes a laser head (not illustrated) that executes exposure processing by irradiating a thin film on a substrate with laser light, based on a program stored in advance in internal storage memory or the like, at a laser output and scanning speed that can selectively remove only a thin film processing target. Here, a known solid-state laser processing machine, semiconductor laser processing machine, or the like can be used as the laser processing device.

Laser irradiation is performed for repair after lighting and dead point detection, and therefore layers such as a sealing layer are formed above the electrode 20 whose resistance is to be increased by laser irradiation. Accordingly, for laser light, it is necessary to select a laser wavelength that does not affect or has a slight effect on an upper layer portion and a lower layer portion of a high resistance metal layer. For example, a wavelength of about 1000 nm or above 1000 nm is preferable.

Laser processing with a pulse width of picoseconds removes target material by raising temperature of a portion irradiated and changing that portion from a solid phase to a liquid phase or even gas phase.

A long pulse width facilitates heat processing. When film thickness of the electrode 20 to be increased in resistance is thick, it is necessary to make pulse width relatively long so as to promote heat processing, but if too long, the heat effect would affect an irradiation peripheral area, and therefore optimization is necessary. For example, when silver of the metal layer of the present embodiment is about 25 nm, and the metal oxide IZO is about 60 nm, about 10 ps to 20 ps is preferable.

During laser processing of the electrode 20, other components are preferably not damaged by laser irradiation. Therefore, by selecting materials for the CF substrate, sealing layer 21, functional layers 15-19, and pixel electrodes 13 that have a lower light absorption rate than the metal layer 20A with respect to wavelength of the irradiating laser beam, these layers are provided with high processing resistance to laser irradiation, and therefore it is possible to prevent laser irradiation damage to the CF substrate, the sealing layer 21, the functional layers 15-19, and the pixel electrodes 13 during laser processing of the electrode 20.

According to the laser repair process above (step S5), repair is performed to recover the abnormal organic EL element 2 that has become a dead point, so that the abnormal organic EL element 2 can be regenerated as the repaired organic EL element 2'.

Returning to FIG. 9, finally, in the panel lighting confirmation test (step S6), the display panel 10 is connected to drive circuitry and the organic EL elements 2 of the display panel 10, including the repaired organic EL element 2', are tested to see whether they light up normally.

<Back Panel Manufacturing Method>

Figure 11:
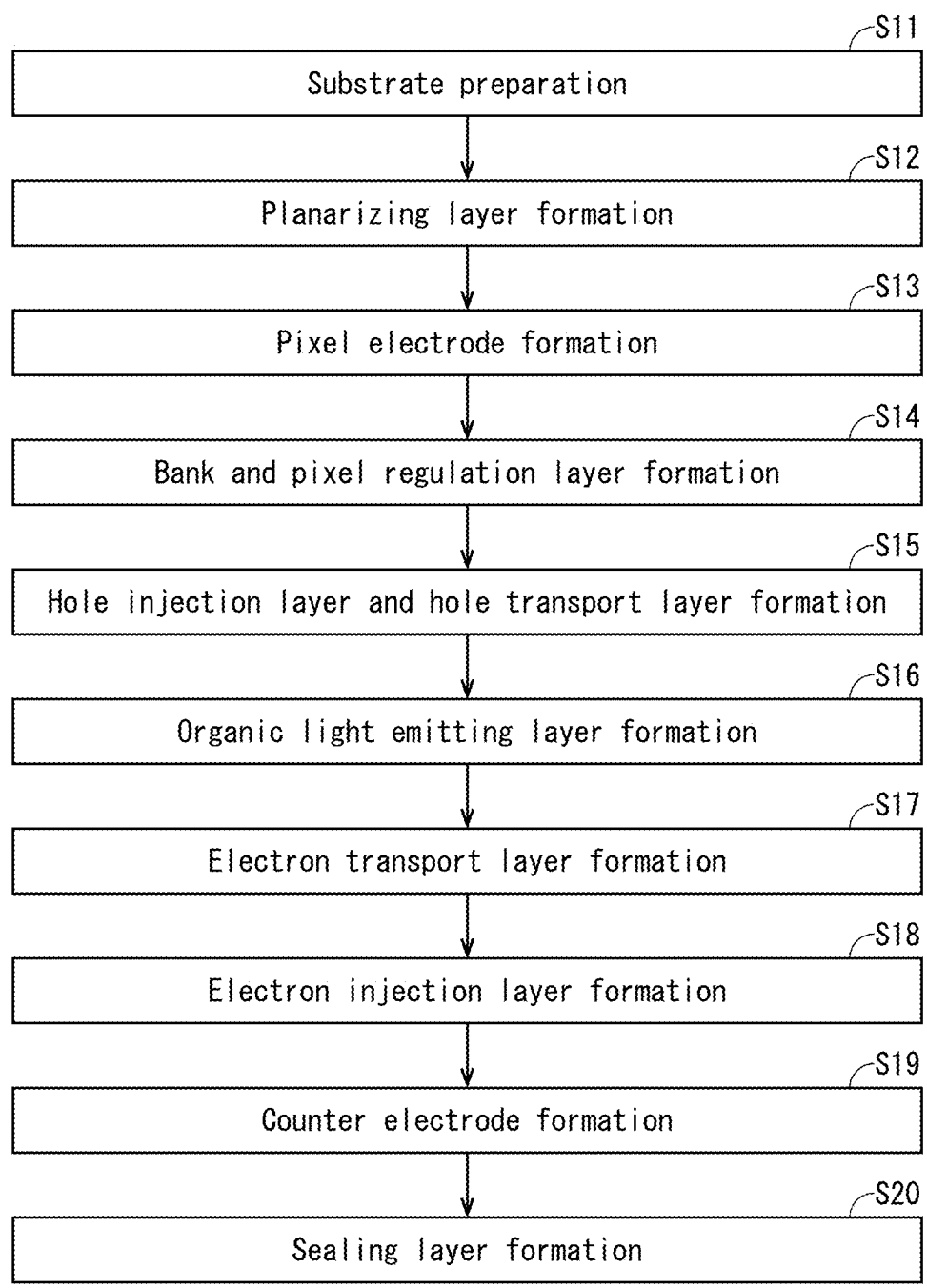
FIG. 11 is a flowchart illustrating an outline of panel manufacture process S1 in FIG. 9.

The following describes an outline of the back panel manufacturing method of the panel manufacturing process (S1), with reference to FIG. 11 through FIG. 15D. FIG. 11 is a flowchart illustrating an outline of the panel manufacturing process (S1) in FIG. 9, and FIG. 12A through FIG. 15D are cross section diagrams schematically illustrating a process of manufacturing the organic EL elements 2. The drawings include schematic diagrams and might not be drawn to scale.

(Substrate Preparation)

Figure 12A:
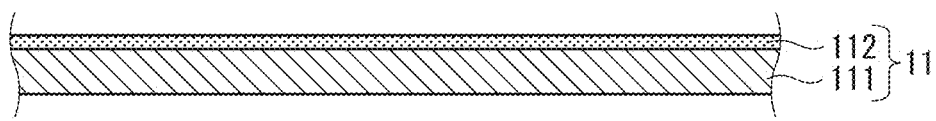
FIG. 12A, 12B, 12C, 12D are cross section view diagrams schematically illustrating manufacturing of organic EL display panel 10.

First, as illustrated in FIG. 12A, the TFT layer 112 is formed on the base 111 to prepare the substrate 11 (step S11 in FIG. 11). The TFT layer 112 can be formed by a known TFT manufacturing method.

(Planarizing Layer Formation)

Figure 12B:
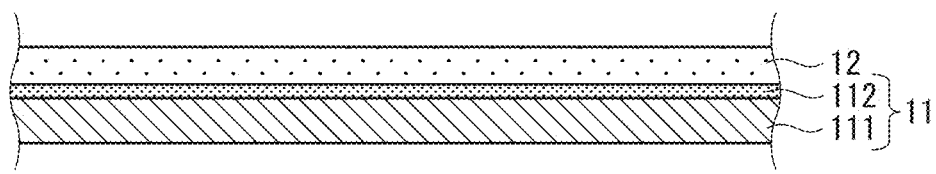

Next, as illustrated in FIG. 12B, the planarizing layer 12 is formed on the substrate 11 (step S12 in FIG. 11).

More specifically, a resin material having a certain fluidity is applied by, for example, a die coating method along a top surface of the substrate 11 so as to fill unevenness of the substrate 11 caused by the TFT layer 112. As a result, a top surface of the planarizing layer 12 has a flat shape following a top surface of the base 111.

Contact holes (not illustrated) are formed by dry etching of the planarizing layer 12 at locations corresponding to TFT elements, for example above source electrodes, then connecting electrode layers are formed along inner walls of the contact holes. The connecting electrode layers may be formed, for example, by forming a metal film by a sputtering method then patterning by a photolithography method and a wet etching method.

(Pixel Electrode Formation)

Figure 12C:
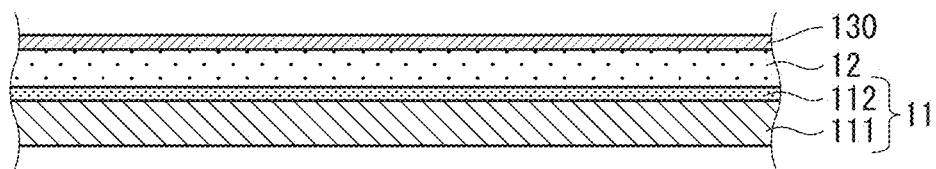
Figure 12D:
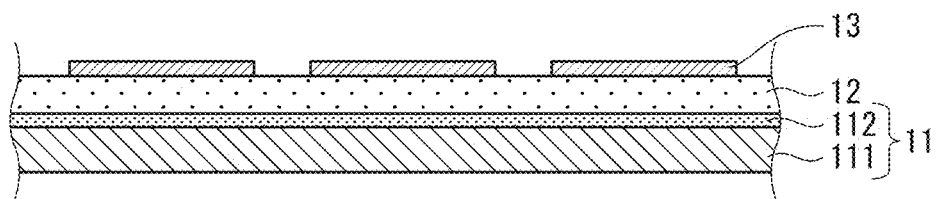

Next, as illustrated in FIG. 12C, a pixel electrode material layer 130 is formed on the planarizing layer 12. The pixel electrode material layer 130 can be formed by, for example, a vacuum vapor deposition method, a sputtering method, or the like. Then, as illustrated in FIG. 12D, the pixel electrode material layer 130 is patterned by etching to form the pixel electrodes 13 partitioned into sub-pixels (step S13 in FIG. 11).

(Banks, Pixel Regulation Layer Formation)

Next, the banks 14 and the pixel regulation layers 141 are formed (step S14 in FIG. 11).

According to the present embodiment, the pixel regulation layers 141 and the banks 14 are formed in separate processes.

[Pixel Regulation Layer Formation]

First, the pixel regulation layers 141 are formed to partition pixel electrode columns in the Y direction (FIG. 3) per sub pixel.

Figure 13A:
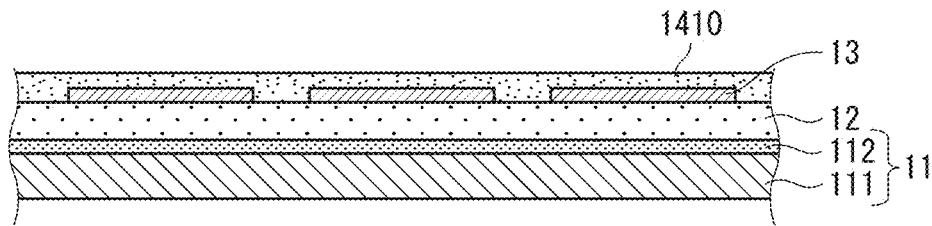
FIG. 13A, 13B, 13C, 13D are cross section view diagrams schematically illustrating manufacturing continuing from FIG. 12D.
Figure 13B:
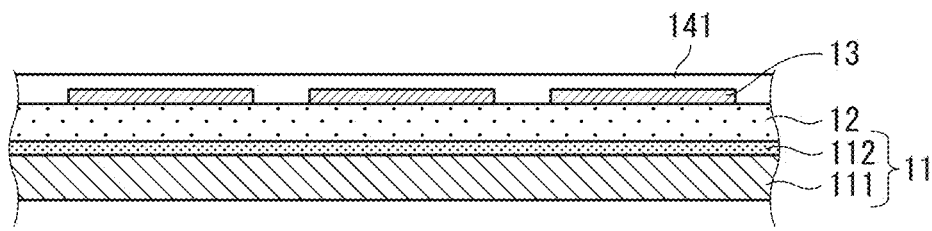

As illustrated in FIG. 13A, a photosensitive resin material used as a material for the pixel regulation layers 141 is uniformly applied onto the planarizing layer 12 on which the pixel electrodes 13 are formed, in order to form a pixel regulation layer material layer 1410. An amount of resin material applied at this time is determined in advance to obtain a target film thickness of the pixel regulation layers 141 after drying.

As specific application methods, examples include a die coating method, a slit coating method, a spin coating method, and the like, which are wet processes. After application, for example, vacuum drying and low temperature heat drying (pre-baking) at about 60° C. to 120° C. are preferably performed to remove unnecessary solvent and fix the pixel regulation layer material layer 1410 to the planarizing layer 12.

Then the pixel regulation layer material layer 1410 is patterned by using a photolithography method. For example, when the pixel regulation layer material layer 1410 has positive photosensitivity, a portion to remain as the pixel regulation layers 141 is shielded from light, and a portion to be removed is exposed to light by a light-transmissive photomask (not illustrated).

Next, the pixel regulation layers 141 can be formed by developing and removing exposed areas of the pixel regulation layer material layer 1410. As a specific developing method, for example, the substrate 11 is entirely immersed in a developing solution such as an organic solvent or alkaline solution that dissolves the exposed portion of the pixel regulation layer material layer 1410, then cleaned with a rinsing solution such as pure water.

Then, by baking (post-baking) at a defined temperature, the pixel regulation layers 141 extending in the X direction can be formed on the planarizing layer 12 (FIG. 13B).
[Bank Formation]

Next, the banks 14 extending in the Y direction are formed in the same way as the pixel regulation layers 141.

Figure 13C:
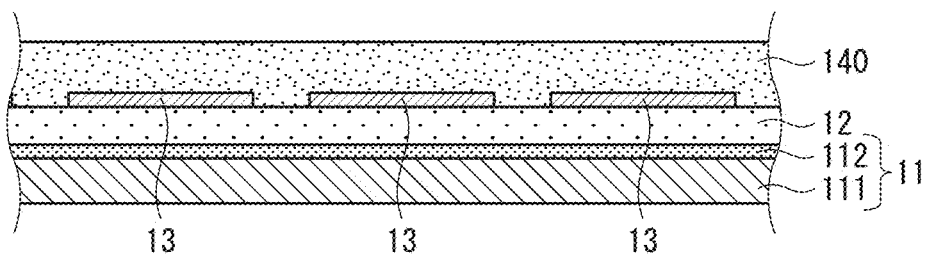
Figure 13D:
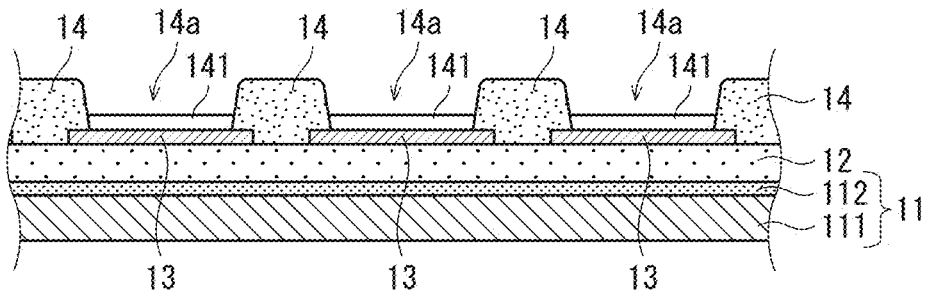

That is, a resin material for banks is applied onto the planarizing layer 12 on which the pixel electrodes and the pixel regulation layers 141 are formed, by using a die coating method or the like to form a bank material layer 140 (FIG. 13C). An amount of resin material applied at this time is determined in advance to obtain a target film height of the banks 14 after drying. Then, after patterning the bank material layer 140 by photolithography into the banks 14 extending in the Y direction, the banks 14 are formed by baking at a defined temperature (FIG. 13D).

As described above, the material layers of the pixel regulation layers 141 and the banks 14 are formed by a wet process then patterned. However, one or both of the material layers may be formed by a dry process, then patterned by photolithography and etching.
(Hole Injection Layers, Hole Transport Layers Formation)

Next, the hole injection layers 15 and the hole transport layers 16 are formed (step S15 in FIG. 11).

First, the hole injection layers 15 are formed from ink composed of a low molecular weight material, having hole injection properties described above, dissolved or dispersed in a mixed solvent, the ink being ejected from nozzles 3011 of an application head 301 of a printing device into the apertures 14a, then the solvent being volatized and/or baked.

The hole transport layers 16 are formed by the same application method as the hole injection layers 15, onto the hole injection layers 15, by using an ink composed of a low molecular weight material, having the hole transport properties described above, dissolved or dispersed in a mixed solvent. As a method for applying ink for forming the hole injection layers 15 and the hole transport layers 16, various printing methods such as an inkjet method or screen printing method, or a wet film-forming method such as a spin coat method or dispenser method can be used.

Further, the hole injection layers 15 and the hole transport layers 16 may be formed by a vapor deposition method such as a vacuum vapor deposition method, a sputtering method, an ion beam vapor deposition method, or a chemical vapor deposition (CVD) method.

Figure 14A:
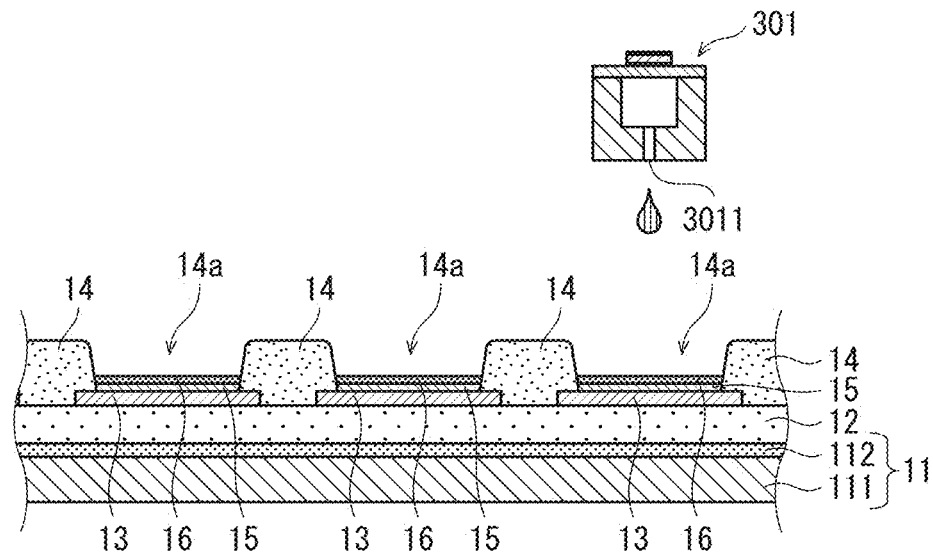
FIG. 14A, 14B are cross section view diagrams schematically illustrating manufacturing continuing from FIG. 13D.

FIG. 14A illustrates a schematic cross section view of the display panel 10 when the hole transport layers 16 are formed, after the hole injection layers 15 are formed.
(Organic Light Emitting Layer Formation)

Next, the organic light emitting layers 17 are formed above the hole transport layers 16 (step S16 in FIG. 11).

Figure 14B:
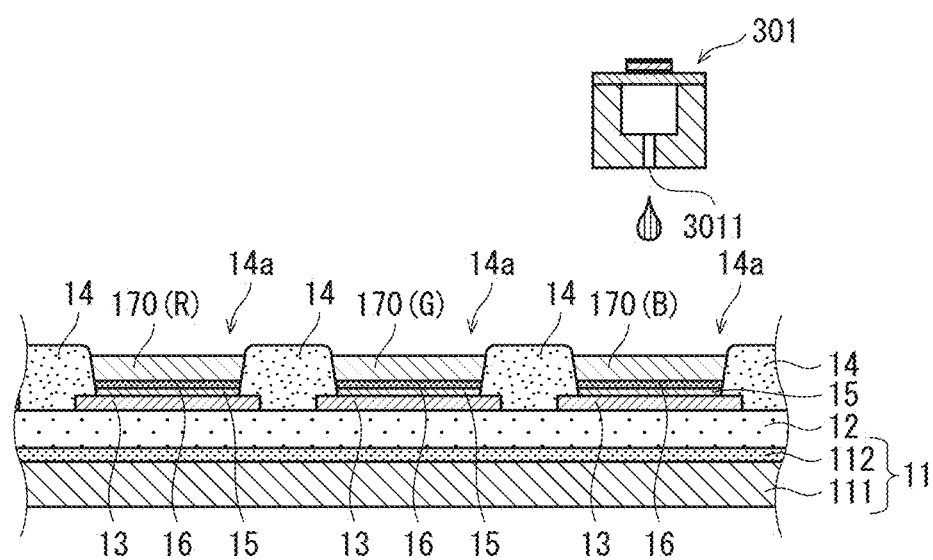

Specifically, for example and as illustrated in FIG. 14B, inks composed of organic light emitting materials dissolved in solvent are sequentially ejected from the nozzles 3011 of the application head 301 of the print device to be applied onto the hole transport layers 16 in the apertures 14a, and after ink application, the substrate 11 is carried into a vacuum drying chamber and heated in a vacuum environment to evaporate the organic solvent. Here, the organic light emitting materials are, among the light emitting materials described above, light emitting materials composed of low molecular weight materials that are constituent materials of organic light emitting layers emitting light corresponding to the apertures 14a.

Further, as a method for applying ink for forming the organic light emitting layers 17, various printing methods such as an inkjet method or screen printing method, or a wet film-forming method such as a spin coat method or dispenser method can be used.
(Electron Transport Layer Formation)

Figure 15A:
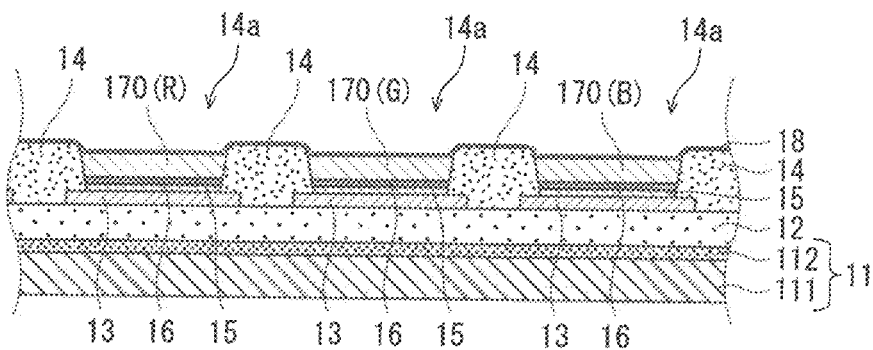
FIG. 15A, 15B, 15C, 15D are cross section view diagrams schematically illustrating manufacturing continuing from FIG. 14B.

Next, as illustrated in FIG. 15A, ink composed of an electron transporting material dissolved in solvent is ejected from the nozzles 3011 of the application head 301 of the print device onto the organic light emitting material layers 170 and the banks 14, and organic solvent is evaporated in the ink to form the electron transport layer 18 (step S17 in FIG. 11).
(Electron Injection Layer Formation)

Figure 15B:
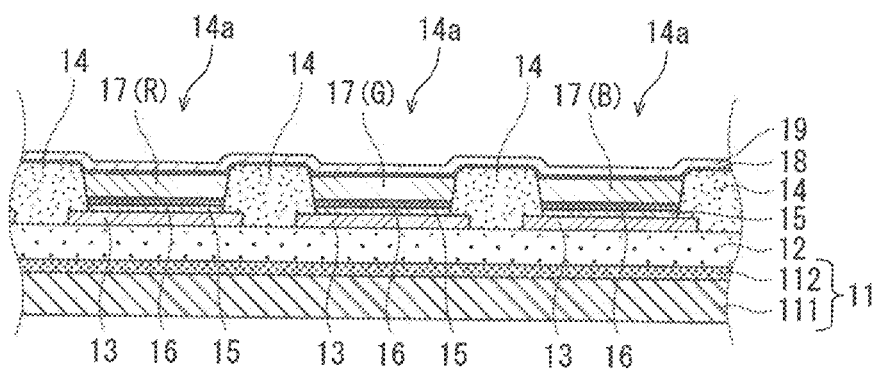

Subsequently, as illustrated in FIG. 15B, an electron injecting material is vacuum vapor deposited on the electron transport layer 18 to form the electron injection layer 19 (step S18 of FIG. 11).
(Counter Electrode Formation)

Figure 15C:
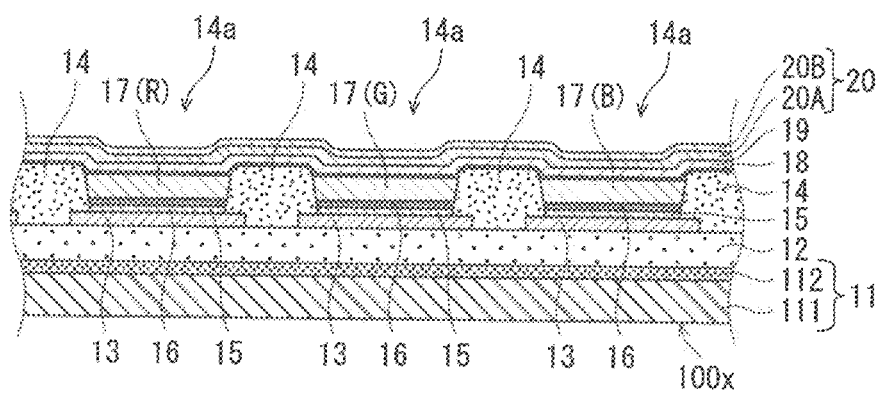

Next, the counter electrode 20 is formed on the electron injection layer 19 (step S19 in FIG. 11; FIG. 15C).

The counter electrode 20 includes the metal layer 20A mainly composed of a metal and the metal oxide layer 20B composed of a metal oxide laminated on the metal layer 20A, in this order from the side of the substrate 100x.

In the counter electrode formation, first, the metal layer 20A is formed by a CVD method, a sputtering method, or a vacuum vapor deposition method applied to silver, aluminum, or the like, onto the electron injection layer 19. According to the present embodiment, the metal layer 20A is formed by deposition of silver by a vacuum deposition method.

Next, the metal oxide layer 20B is formed by a sputtering method or the like so as to cover the metal layer 20A. According to the present embodiment, the metal oxide layer 20B is a light-transmissive electrically conductive layer of ITO, IZO, or the like, formed by using a sputtering method.
(Sealing Layer Formation)

Figure 15D:
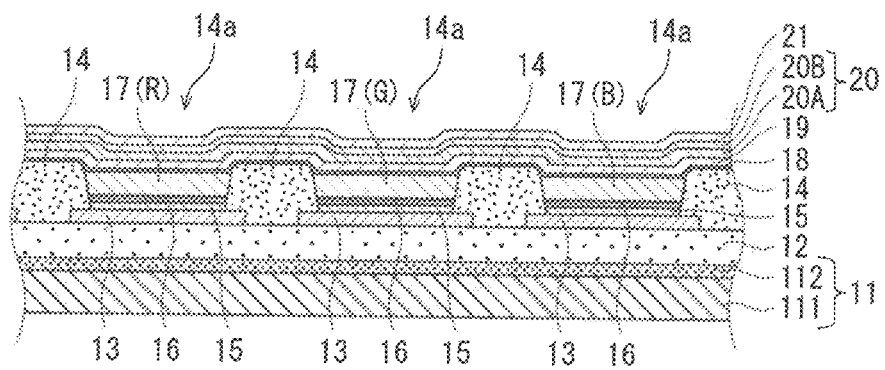

Next, as illustrated in FIG. 15D, the sealing layer 21 is formed on the counter electrode 20 (step S20 in FIG. 11). The sealing layer 21 can be formed by forming a film of SiON, SiN, or the like by a sputtering method, a CVD method, or the like.

As above, the display panel 10 illustrated in FIG. 3 is manufactured. The above manufacturing method is merely an example, and can be appropriately changed according to purpose.

<<Circuit Structure of Organic EL Display Device 1>>

Figure 16:
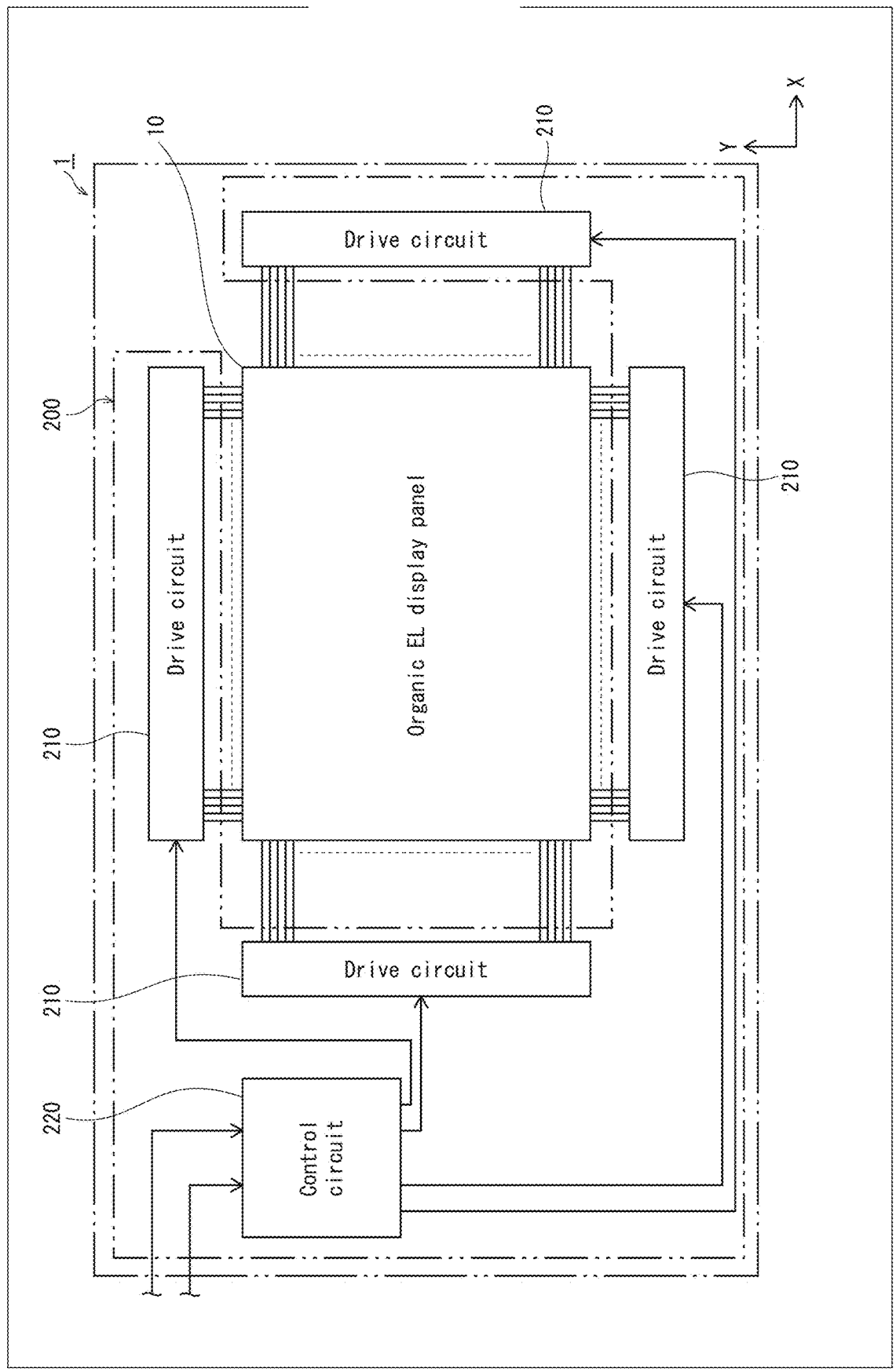
FIG. 16 is a schematic block diagram illustrating circuit structure of an organic EL display device according to an embodiment.

The following describes circuit structure of the organic EL display device 1 (also referred to as "display device 1") that uses the display panel 10 pertaining to an embodiment, with reference to FIG. 16. The display panel 10 has a function of executing a light emitting operation, as described above.

FIG. 16 is a block diagram illustrating overall structure of the organic EL display device 1. The organic EL display device 1 is used, for example, as a display of a television, a personal computer, a mobile terminal, or other electronic device. As illustrated in FIG. 16, the display device 1 includes the display panel 10 and drive control circuitry 200 connected to the display panel 10.

The display panel 10 includes a plurality of organic EL elements in a matrix, for example. Drive control circuitry 200 is composed of four drive circuits 210 and a control circuit 220. For example, the display panel 10 adopts an active matrix method.

The drive control circuitry 200 includes the drive circuits 210 connected to the display panel 10 and the control circuit 220 connected to an external device such as a computer or a receiver such as a TV tuner.

The drive circuits 210 each include a power supply circuit that supplies power to each organic EL element, a signal circuit that applies a voltage signal that controls power supplied to each organic EL element, and a scanning circuit that switches locations to apply voltage signals at regular intervals in a light emitting operation.

The control circuitry 220 controls operations of the drive circuits 210 according to data including image information input from an external device or receiving device.

In the display panel 10, the unit pixels 100e are arranged in a matrix to form a display area. Each of the unit pixels 100e is composed of three organic EL elements, that is, three sub-pixels 100se that emit red (R), green (G), and blue (B) light, respectively. The circuit structure of each sub-pixel 100se is described with reference to FIG. 17.

Figure 17:
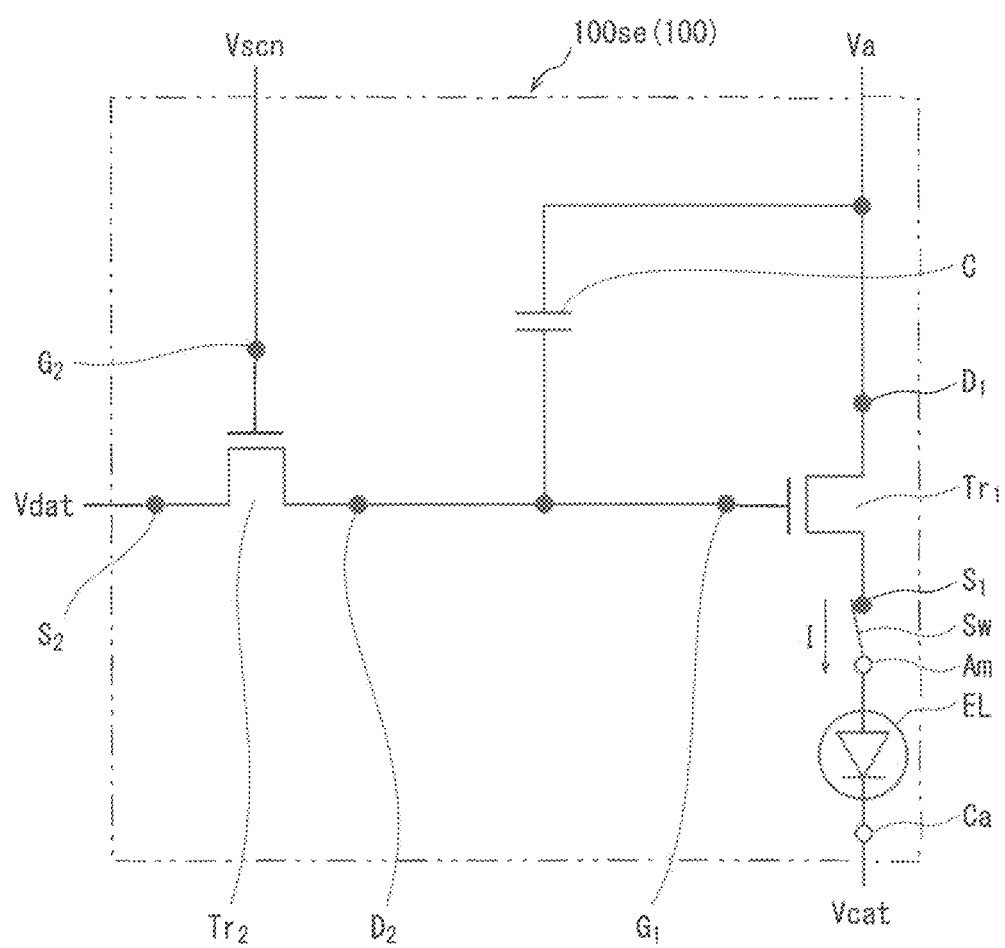
FIG. 17 is a schematic circuit diagram illustrating circuit structure of sub-pixel 100se of organic EL display panel 10 used in an organic EL display device.

FIG. 17 is a circuit diagram illustrating a circuit structure of the light emitting element 100 corresponding to each of the sub-pixels 100se of the display panel 10 used in the display device 1.

As illustrated in FIG. 17, in the display panel 10 according to the present embodiment, each of the sub-pixels 100se includes two transistors Tr1, Tr2, a capacitor C, and an organic EL element unit EL as a light emitting unit. The transistor Tr1 is a drive transistor and the transistor Tr2 is a switching transistor.

A gate G2 of the switching transistor Tr2 is connected to a scan line Vscn, and a source S2 is connected to a data line Vdat. A drain D2 of the switching transistor Tr2 is connected to a gate G1 of the drive transistor Tr1.

A drain D1 of the drive transistor Tr1 is connected to a power source line Va, and a source S1 is connected when lit to a pixel electrode Am (anode) of the organic EL element EL by a switch Sw. A counter electrode Ca (cathode) of the organic EL element EL is connected to a ground line Vcat. Thus, during light emission, a current I flows from the source S1 to the ground line Vcat via the organic EL element EL.

A first end of the capacitor C is connected to the drain D2 of the switching transistor Tr2 and the gate G1 of the drive transistor Tr1, and a second end of the capacitor C is connected to the power source line Va.

In the display panel 10, a plurality of adjacent sub-pixels 100se (for example, three sub-pixels 100se with light emission colors red (R), green (G), and blue (B)) are combined to form one unit pixel 100e, and the unit pixels 100e are distributed to form a pixel area. For each of the sub-pixels 100se, a gate line leads out from the gate G2 and is connected to scan line Vscn connected from outside the display panel 10. Similarly, for each of the sub-pixels 100se, a source line leads out from the source S2 and is connected to the data line Vdat connected from outside the display panel 10.

Further, power source lines Va and ground lines Vcat of the sub-pixels 100se are aggregated and connected to a power source line and a ground line of the display device 1.

<Review>

As described above, the self-luminous elements 2 according to at least one embodiment are arranged on a plane in the display panel 10, and each of the self-luminous elements 2 includes a pair of electrodes 13, 20, functional layers 15, 16, 17, 18, 19 including a light emitting layer 17, and a sealing layer 21. The pair of electrodes 13, 20 face other, and an electrode of the pair of electrodes 13, 20 includes a metal layer 20A, The functional layers 15, 16, 17, 18, 19 are disposed between the pair of electrodes 13, 20, The sealing layer 21 covers the pair of electrodes 13, 20 and the functional layers 15, 16, 17, 18, 19 from a direction. The self-luminous elements 2 include a repaired self-luminous element 2' that further includes a foreign object FO among the functional layers 15, 16, 17, 18, 19. The electrode 20 including the metal layer 20A has a high resistance portion 201 surrounding, in plan view, an area containing the foreign object FO, and has a thickened portion 202 of the metal layer 20A at an outer edge, in plan view, of the high resistance portion 201.

As a result, the high resistance portion 201 can increase electrical resistance between the foreign object FO and the area 203 surrounding the high resistance portion 201.

This structure can provide a self-luminous display panel and a self-luminous display panel manufacturing method that can repair a dead point light emitting element by laser irradiation from outside of a short-circuited portion in a light emitting element to remove or increase resistance when thickness of the metal layer forming the electrode is thick.

That is, in the organic EL element 2 irradiated by the picosecond laser LS2, even when thickness of the metal layer 20A of the electrode is thick, material of the irradiated portion of the metal layer 20A and the metal oxide layer 20B can be melted by heat to increase resistance and form the high resistance portion 201. By using the picosecond laser LS2, there is no risk that applied energy is too great, which could lead to the metal layer 20A and/or the metal oxide layer 20B short circuiting with the pixel electrode 13, or the pixel electrode 13 being damaged leading to a malfunction such that lighting fails. Further, materials of the material layer 20A and the metal oxide layer 20B move and solidify again, so that the thickened portion 202 of the metal layer 20A is formed on the outer edge 201a of the high resistance portion 201. As a result, it is possible to prevent material of the metal layer 20A and/or the metal oxide layer 20B and/or debris of the foreign object FO from being scattered inside the organic EL element 2 due to laser irradiation of material of the irradiated portion.

As a result, it is possible to suppress occurrence of dead points due to repair failure caused by the presence of scattered metal layer fragments inside a repaired light emitting element.

<Effects>

As described, the self-luminous display panel and self-luminous display panel manufacturing method according to at least one embodiment provide a self-luminous display panel and self-luminous display panel manufacturing method in which a dead point light emitting element can be repaired by laser irradiation from outside of a short-circuited portion in a light emitting element to remove or increase resistance when thickness of the metal layer forming the electrode is thick.

<<Modifications>>

Although the organic EL element 2 and the like are described above according to embodiments, the present invention is not limited to the above embodiments except in terms of essential characterizing components. For example, various modifications achievable by a person having ordinary skill in the art, and any combination of elements and functions of embodiments and modifications that do not depart from the spirit of the present invention are also included in the present invention. The following describes modifications of the organic EL elements and organic EL display panel as examples of such embodiments.

(1) According to at least one embodiment, the high resistant portion 201 is a ring-shaped portion L0 of the electrode including the metal layer 20A that surrounds the foreign object FO in plan view. However, aspects of the high resistance portion 201 may be changed as appropriate, as long as the high resistance portion 201 in the counter electrode 20 including the metal layer 20A has a structure in which electrical resistance is increased between the foreign object FO and the area 203 surrounding the area containing the foreign object FO in plan view.

In a modification, for example, the high resistance portion 201 may be a portion of the electrode including the metal layer 20A that contains the foreign object FO in plan view.

According to this structure, the high resistance portion 201 can be limited to a portion of the counter electrode 20 including the metal layer 20A located above the foreign object FO, and area of the high resistance portion 201 can be reduced in comparison to that of an embodiment described above. As a result, a ratio of light emitting area of the organic light emitting layer 17 in the repaired organic EL element 2' can be increased when compared to an embodiment described above.

(2) According to another modification, for example, the high resistance portion 201 may have a double structure composed of an inner area surrounding an area containing the foreign object FO and an outer area surrounding the inner area in plan view.

According to this structure, it is possible to improve the reliability of increasing electrical resistance between the foreign object FO and the area 203 surrounding the area containing the foreign object FO when compared to an embodiment described above.

(3) According to an embodiment described above, the counter electrode 20 has a structure composed of the lower metal layer 20A of silver having a thickness of 25 nm and the upper metal oxide layer 20B of IZO having a thickness of 60 nm. However, the counter electrode 20 may have a structure including the metal layer 20A having a thickness of 20 nm or more, for example, and the laminated structure of the counter electrode 20 may have a structure other than that described above. For example, the metal layer 20A may be an upper layer and the metal oxide layer 20B may be a lower layer, or a sandwich structure composed of a metal oxide layer, a metal layer, and a metal oxide layer. In this case, the metal oxide layers may be composed of different materials.

(4) According to an embodiment described above, the foreign object FO is mainly composed of a metal particle such as iron, aluminum, stainless steel, or the like. However, the foreign object FO may be a foreign object other than a metal particle as long as it is a foreign object than can cause a dead point and that includes electrically conductive material other than constituent material of a functional layer.

(5) According to an embodiment described above, the cathode is the counter electrode and is part of a top emission type of organic EL element. However, for example, the anode may be the counter electrode and the cathode may be a pixel electrode. Further, for example, a bottom emission type of organic EL element may be used.

(6) Further, according to an embodiment described above, the organic EL element 2 has a structure including the electron transport layer 18, the electron injection layer 19, the hole injection layers 15, and the hole transport layers 16, but the structure is not limited to this. For example, the organic EL element may have a structure without the electron transport layer 18 or without the hole transport layers 16. Further, for example, instead of the hole injection layers 15 and the hole transport layers 16, combined hole injection transport layers may be used.

(7) At least one embodiment is described as a line bank type of organic EL display panel in which banks are formed in columns, but an embodiment may be a pixel bank type of organic EL display panel in which banks are formed in a grid pattern surrounding each sub-pixel.

(8) An embodiment described above is an organic EL display panel using organic EL elements as self-luminous elements, but display panels such a quantum dot display panel using quantum dot light emitting elements (quantum dot light emitting diodes; QLED) are different only in light emitting layer structure and type, and structure of a light emitting layer between a pixel electrode and a counter electrode, and other functional layers being interposed, are the same as an organic EL display panel, and therefore the present invention can be applied.

(9) According to an embodiment described above, the thickened portion of the metal layer formed on the edge of the metal layer high resistance portion due to laser irradiation is described as forming due to movement of the metal layer downwards, but the thickened portion may be formed by upwards movement.

<<Supplement>>

A self-luminous display panel and method for manufacturing same according to an aspect of the present disclosure have been described based on embodiments and modifications, but the present invention is not limited to the above embodiments and modifications. For example, various embodiments and modifications achievable by a person having ordinary skill in the art, and any combination of elements and functions of embodiments and modifications that do not depart from the spirit of the present invention are also included in the present invention.

The invention claimed is:

1. A self-luminous display panel in which self-luminous elements are arranged on a plane, wherein
each of the self-luminous elements comprises:
a pair of electrodes disposed facing each other, an electrode of the pair of electrodes including a metal layer;
functional layers including a light emitting layer, disposed between the pair of electrodes; and a sealing layer that covers the pair of electrodes and the functional layers from a direction, wherein
the self-luminous elements include a repaired self-luminous element, and
the repaired self-luminous element further comprises:
a foreign object among the functional layers, wherein
the electrode including the metal layer has a high resistance portion surrounding, in plan view, an area containing the foreign object, and has a thickened portion of the metal layer at an outer edge, in plan view, of the high resistance portion.

2. The self-luminous display panel of claim 1, wherein the high resistance portion is a ring-shaped portion of the electrode including the metal layer that surrounds the foreign object in plan view.

3. The self-luminous display panel of claim 1, wherein a thickness of the thickened portion of the metal layer decreases as distance from the high resistance portion increases in plan view.

4. The self-luminous display panel of claim 1, wherein the electrode including the metal layer further includes a layer made of a metal oxide.

5. A self-luminous display panel in which self-luminous elements are arranged on a plane, wherein
each of the self-luminous elements comprises:
a pair of electrodes disposed facing each other, an electrode of the pair of electrodes including a metal layer;
functional layers including a light emitting layer, disposed between the pair of electrodes; and
a sealing layer that covers the pair of electrodes and the functional layers from a direction, wherein
the self-luminous elements include a repaired self-luminous element,
the repaired self-luminous element further comprises:
a foreign object among the functional layers, wherein
the electrode including the metal layer has a high resistance portion that is a portion of the electrode including the metal layer that contains the foreign object, in plan view, and has a thickened portion of the metal layer at an outer edge, in plan view, of the high resistance portion.

6. The self-luminous display panel of claim 5, wherein the high resistance portion is a portion of the electrode including the metal layer that is disposed above the foreign object.

7. The self-luminous display panel of claim 5, wherein a thickness of the thickened portion of the metal layer decreases as distance from the resistance portion increases in plan view.

8. The self-luminous display panel of claim 5, wherein the electrode including the metal layer further includes a metal oxide layer.

9. A method of manufacturing a self-luminous display panel in which self-luminous elements are arranged on a plane, comprising:
a process of forming the self-luminous elements on a substrate surface;
a process of driving the self-luminous elements to detect an abnormal self-luminous element; and
a process of repairing the abnormal self-luminous element, wherein
the process of forming the self-luminous elements comprises:
a sub-process of forming a pair of electrodes disposed facing each other, an electrode of the pair of electrodes including a metal layer;
a sub-process of forming functional layers including a light emitting layer disposed between the pair of electrodes; and
a sub-process of forming a sealing layer that covers the pair of electrodes and the functional layers, wherein
the process of repairing the abnormal self-luminous element comprises:
a process of detecting a position of a foreign object in the abnormal self-luminous element; and
a process of forming a high resistance portion in the electrode including the metal layer in the abnormal self-luminous element, where the high resistance portion, in plan view, surrounds an area containing the foreign object, wherein
in the process of forming the high resistance portion, a thickened portion of the metal layer close to an outer edge of the high resistance portion is formed.

10. The method of manufacturing the self-luminous display panel of claim 9, wherein
in the process of forming the high resistance portion, a ring-shaped portion of the electrode including the metal layer that surrounds the foreign object in plan view is irradiated by a laser having a picosecond pulse width.

11. The method of manufacturing the self-luminous display panel of claim 9, wherein
in the process of forming the high resistance portion, the thickened portion is formed by metal in the metal layer being melted by irradiation by a laser having a picosecond pulse width and a portion of the metal layer moving.

12. The method of manufacturing the self-luminous display panel of claim 9, wherein
the electrode including the metal layer further includes a metal oxide layer.

13. A method of manufacturing a self-luminous display panel in which self-luminous elements are arranged on a plane, the method comprising:
a process of forming the self-luminous elements on a substrate surface;
a process of driving the self-luminous elements to detect an abnormal self-luminous element; and
a process of repairing the abnormal self-luminous element, wherein
the process of forming the self luminous elements comprises:
a sub-process of forming a pair of electrodes disposed facing each other, an electrode of the pair of electrodes including a metal layer;
a sub-process of forming functional layers including a light emitting layer disposed between the pair of electrodes; and
a sub-process of forming a sealing layer that covers the pair of electrodes and the functional layers, wherein
the process of repairing the abnormal self-luminous element comprises:
a process of detecting a position of a foreign object in the abnormal self-luminous element; and
a process of forming a high resistance portion in the electrode including the metal layer in the abnormal self-luminous element, where the high resistance portion, in plan view, contains an area containing the foreign object, wherein
in the process of forming the high resistance portion, a thickened portion of the metal layer close to an outer edge of the high resistance portion is formed.

14. The method of manufacturing the self-luminous display panel of claim 13, wherein in the process of forming the high resistance portion, the portion of the electrode including the metal layer that contains the foreign object in plan view is irradiated by a laser having a picosecond pulse width.

15. The method of manufacturing the self-luminous display panel of claim 13, wherein in the process of forming the high resistance portion, the thickened portion is formed by metal in the metal layer being melted by irradiation by a laser having a picosecond pulse width and a portion of the metal layer moving.

16. The method of manufacturing the self-luminous display panel of claim 13, wherein the electrode including the metal layer further includes a metal oxide layer.

* * * * *